US008816887B2

(12) United States Patent
Hurrell et al.

(10) Patent No.: US 8,816,887 B2
(45) Date of Patent: Aug. 26, 2014

(54) SAMPLING CIRCUIT, A METHOD OF REDUCING DISTORTION IN A SAMPLING CIRCUIT, AND AN ANALOG TO DIGITAL CONVERTER INCLUDING SUCH A SAMPLING CIRCUIT

(71) Applicant: Analog Devices, Inc., Norwood, MA (US)

(72) Inventors: Christopher Peter Hurrell, Berkshire (GB); Roberto Maurino, Turin (IT)

(73) Assignee: Analog Devices, Inc., Norwood, MA (US)

( * ) Notice: Subject to any disclaimer, the term of this patent is extended or adjusted under 35 U.S.C. 154(b) by 43 days.

(21) Appl. No.: 13/624,334

(22) Filed: Sep. 21, 2012

(65) Prior Publication Data

US 2014/0085117 A1 Mar. 27, 2014

(51) Int. Cl.
*H03M 1/00* (2006.01)
(52) U.S. Cl.
USPC ........... 341/122; 341/130; 341/136; 341/155; 327/91; 327/94; 327/95; 327/96; 327/109

(58) Field of Classification Search
USPC .................................................. 341/122–172
See application file for complete search history.

(56) References Cited

U.S. PATENT DOCUMENTS

| | | | |
|---|---|---|---|
| 6,653,967 B2 * | 11/2003 | Hamashita | 341/172 |
| 7,076,229 B2 * | 7/2006 | Wang | 455/296 |
| 7,924,062 B2 * | 4/2011 | Chiu | 327/94 |
| 7,944,386 B2 * | 5/2011 | Hurrell et al. | 341/155 |
| 8,542,066 B2 * | 9/2013 | Kusuda | 330/308 |
| 2004/0160351 A1 * | 8/2004 | Rossi | 341/161 |

* cited by examiner

*Primary Examiner* — Lam T Mai
(74) *Attorney, Agent, or Firm* — Kenyon & Kenyon LLP

(57) ABSTRACT

A sampling circuit comprising: an input node; a first signal path comprising a first sampling capacitor and a first signal path switch in a signal path between the input node and a first plate of the first sampling capacitor; a second signal path comprising a second sampling capacitor and a second signal path switch in a signal path between the input node and a first plate of the second sampling capacitor, and a signal processing circuit for forming a difference between a signal sampled onto the first sampling capacitor and a signal sampled onto the second sampling capacitor.

25 Claims, 21 Drawing Sheets

Main switch for unit size capacitor (N=9)

Compensation switch for unit size capacitor (N=9)

| STAGE | C1 weights | C2 weights | Net weight |
|---|---|---|---|
| 1 | 64 + 4 | 4 | 64 |
| 2 | 32 + 2 | 2 | 32 |
| 3 | 16 + 1 | 1 | 16 |
| 4 | 8 + 1 | 1 | 8 |
| 5 | 8 + 1 | 1 | 8 |
| 6 | 4 | | 4 |
| 7 | 2 | | 2 |
| 8 | 1 | | 1 |
| Total | 144 | 9 | |

FIG. 19

| Bit | C1 weights | C2 weights | Net weight |
|---|---|---|---|
| <4> | 64 + 8 | -8 | 64 |
| <3> | 32 + 4 | -4 | 32 |
| <2> | 16 + 2 | -2 | 16 |
| <1> | 8 + 1 | 1- | 8 |
| Total | 135 | 15 | |

US 8,816,887 B2

SAMPLING CIRCUIT, A METHOD OF REDUCING DISTORTION IN A SAMPLING CIRCUIT, AND AN ANALOG TO DIGITAL CONVERTER INCLUDING SUCH A SAMPLING CIRCUIT

FIELD OF THE INVENTION

The invention relates to an improved sampling circuit, to a method of reducing distortion resulting from a sampling circuit, and to an analog to digital converter including an improved sampling circuit.

BACKGROUND

In sample and hold circuits, it is generally desirable to provide an electrically operated switch that notionally switches between high impedance (off) and low impedance (on) states.

One switch technology that is suited for use in precision converters is a "transmission gate" arrangement. However, such a configuration is made with real field effect transistors whose drain-source resistance $R_{DSon}$ varies with the input voltage at an input terminal of the transmission gate. Therefore in the context of a sampling circuit comprising a transmission gate in series with a sampling capacitor, the series resistance of the transmission gate varies with input voltage, and this is a source of distortion, degrading the total harmonic distortion performance of the sampling circuit, and of subsequent or associated devices such as analog to digital converters.

The "on" resistance of the FETs making up the transmission gate can be reduced by making the transistors wider. However this increases the values of parasitic capacitances associated with the transistor switches, which themselves are non-linear, resulting in an increase in distortion from a secondary distortion mechanism resulting from an interaction between the non-zero impedance of a signal source driving the sampling circuit (whether the operation of the sampling circuit is a "sample and hold" or "track and hold" style of operation) and this increased non-linear capacitance.

SUMMARY OF THE INVENTION

According to a first aspect of the present invention there is provided a sampling circuit comprising: an input node; a first signal path comprising a first sampling capacitor and a first signal path switch in a signal path between the input node and a first plate of the first sampling capacitor; a second signal path comprising a second sampling capacitor and a second signal path switch in a signal path between the input node and a first plate of the second sampling capacitor, and a signal processing circuit for forming a difference between a signal sampled onto the first sampling capacitor and a signal sampled onto the second sampling capacitor.

In an embodiment of the invention, the first and second capacitors have dissimilar capacitances and/or the switches are fabricated to have dissimilar on resistances. This gives rise to dissimilar sized errors due to the on resistance of the switches. With appropriate selection of component values the error can be estimated or the errors in the first and second channels can be arranged to substantially cancel each other.

A sampling capacitor may be formed as a sum of a plurality of capacitors. The plurality of capacitors may be associated with respective switches such that they can be switched into and out of various combinations with each other, for example, as part of a successive approximation conversion.

Advantageously the switches are formed by field effect transistors. The first switch may be formed from at least one NMOS transistor forming an NMOS switch in parallel with at least one PMOS transistor forming a PMOS switch.

Similarly the second switch may be formed from at least one NMOS transistor forming an NMOS switch in parallel with at least one PMOS transistor forming a PMOS switch.

In an embodiment the NMOS switch in the first switch comprises parallel connected NMOS transistors, whereas the NMOS switch in the second switch comprises series connected NMOS transistors. The switches may also comprise parallel and series connected PMOS transistors respectively.

According to a further aspect of the present invention there is provided a method of correcting for voltage errors in a sampling network, comprising forming two sampling networks where at least one of the capacitances and switch resistances vary between one network and the other such that dissimilar sampling errors occur, and processing the dissimilar errors so as to estimate or to remove the sampling error from a sample result.

BRIEF DESCRIPTION OF THE DRAWINGS

Embodiments of the invention will now be described, by way of non-limiting example only, with reference to the accompanying Figures, in which:

FIG. 19 is a table showing the relative weights for the most significant 8 bits of a SAR converter;

DESCRIPTION OF EXAMPLE EMBODIMENTS OF THE INVENTION

The present invention addresses distortion mechanisms that occur due to subtleties in the operation of sample and hold circuits. In view of this, a review of commonly used sampling circuits follows such that the deficiencies with such circuits can be discussed.

Figure 1:
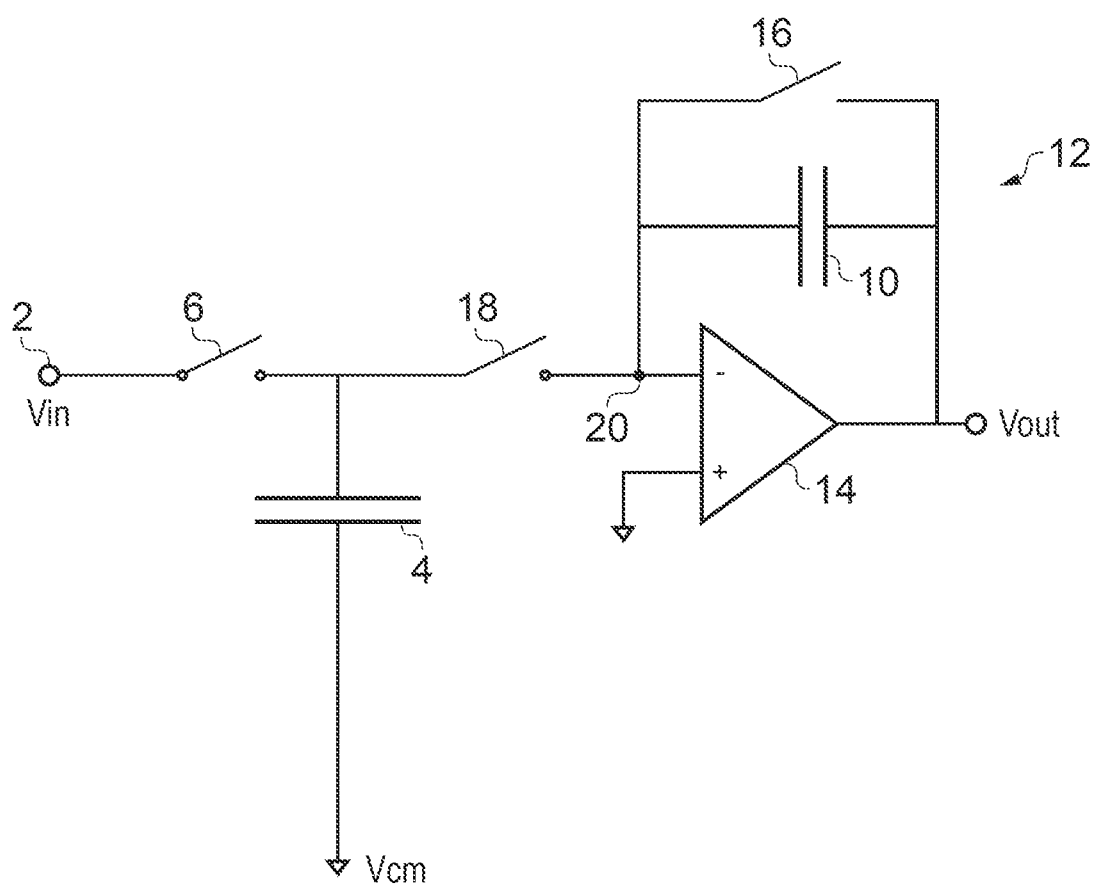
FIG. 1 is a circuit diagram of a prior art sample and hold circuit.

FIG. 1 shows a known sampling stage for use in sampling a signal and providing it to a subsequent circuit, such as digital to analog converter.

A signal to be sampled, $V_{in}$, is supplied to an input node 2 of the sampling circuit shown in FIG. 1. The input node 2 is connected to a first plate of a sampling capacitor 4 by way of a first sampling switch 6. A second plate of the sampling capacitor is connected to a reference voltage, for example a signal ground or a common mode voltage $V_{cm}$.

During a sampling phase the first sampling switch 6 is closed (low impedance) such that the input voltage $V_{in}$ appears across the sampling capacitor 4.

During a hold phase the first sampling switch 6 is placed in a high impedance state so as to "freeze" or hold the voltage stored on the sampling capacitor 4.

The terminology used around sampling circuits of this type can vary. Some practitioners may use the terminology "sample and hold" or "track and hold". In this terminology, the first sampling switch 6 may be only made low impedance for a short period, giving rise to the idea of a near instantaneous sampling of the voltage at the input node 2 onto the sampling capacitor 6. This corresponds to "sample and hold" operation. In an alternative mode of operation the first sampling switch may be driven to a low impedance state for a longer period of time, giving rise to the idea that the voltage on the sampling capacitor 6 tracks the voltage at the input node, hence "track and hold" operation.

However, other practitioners may use an "acquisition and sample" terminology. Here the acquisition part refers to the period when the first sampling switch is in a low impedance state, and the "sample" part refers to the moment when the signal is sampled (held in the previous terminology) onto the sampling capacitor such that the voltage thereon is "frozen".

Due to potential confusion over nomenclature, "acquire" will generally be used to describe the period when the first switch is low impedance, and "hold" will generally be used to describe when the signal has been captured onto the sampling capacitor and the first switch (or a similar series connected switch) has been placed in a high impedance state.

The charge stored on the sampling capacitor 4 can be transferred to a further capacitor 10 of a charge transfer amplifier 12. In a simple version of a charge transfer amplifier 12, the further capacitor 10 is placed in the feedback loop of an operational amplifier 14 configured such that an input node 20 of the operational amplifier 14 acts as a virtual earth. A shorting switch 16 is placed in parallel with the further capacitor 10 so as to discharge the capacitor 10 in preparation for receiving charge from the sampling capacitor 4.

A transfer switch 18 is provided between the first plate of the sampling capacitor 4 and the node 20 of the charge transfer amplifier 12. During charge transfer the shorting switch 16 is opened, and then the transfer switch 18 is closed. Charge from the sampling capacitor 4 flows towards the virtual earth created by the operational amplifier 14, and in so doing the charge becomes stored on the further capacitor 10.

It can be seen that the arrangement in FIG. 1 has an inverting action, such that an output voltage, $V_{out}$, is given by:

$$V_{out} = V_{in} \times \frac{-C_1}{C_2} \quad \text{(equation 1)}$$

where $C_1$ is the capacitance of the sampling capacitor 4; and $C_2$ is the capacitance of the further capacitor 10.

A problem with this circuit is that the switches 6 and 18 each exhibit non-linear capacitances. Thus following the sample phase, the charge stored on the sampling capacitor is augmented by charge stored on non-linear parasitic capacitances associated with the switches 6 and 18. These non-linear capacitances vary as a function of the voltage sampled onto the sampling capacitor 4.

Similarly, when charge is transferred to the further capacitor 10, the shorting switch 16 is in a high impedance state, and the non-linear parasitic capacitances associated with that switch appear in parallel with the further capacitor 10, and vary as a function of $V_{out}$. Thus, the gain of the circuit varies as a non-linear function of the input voltage. Variations of gain with respect to input voltage give rise to harmonic distortion.

Sometimes an inverting gain is not desirable, and a swap circuit needs to be built around the sampling capacitor to overcome this. Such a circuit is shown in FIG. 2.

Figure 2:
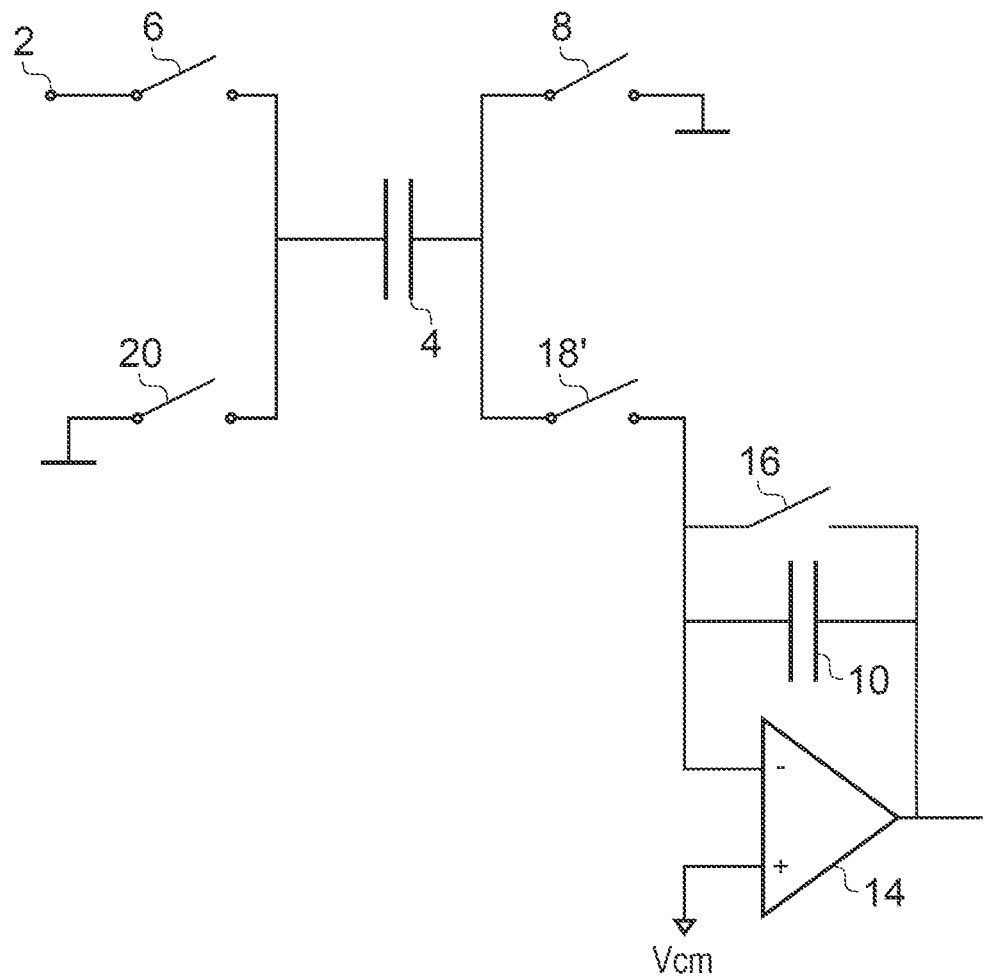
FIG. 2 is a circuit diagram of a further prior art sample and hold circuit.

The circuit shown in FIG. 2 is similar to that shown in FIG. 1, except that an additional circuit is provided to effectively allow the sampling capacitor 4 to be "turned around" between the acquisition and sample phases. To do this a second sampling switch 8 is introduced between the second plate of the sampling capacitor 4 and ground. The transfer switch 18 is no longer connected to the first plate of the sampling capacitor, instead an equivalent transfer switch 18' is connected between the second plate of the sampling capacitor and the inverting input of the amplifier 14. Additionally a second transfer switch 20 is provided between the first plate of the sampling capacitor 4 and ground.

This arrangement is a significant improvement over the circuit of FIG. 1 because switches 20, 8 and 18 work at known voltages (i.e. one terminal is connected to ground). Thus its DC performance is better than that of the circuit of FIG. 1. However, both circuits state exhibit errors when operating with AC signals due to the non-zero impedance of switch 6. In fact, not only is the switch impedance non-zero, but as will be discussed below, it is not constant either which gives rise to an effective gain which varies with input voltage, which the person skilled in the art recognises as a source of distortion.

The switches 6, 8, 18', 20 and 16 are, in reality, implemented by FETs. In, for example, an analog to digital converter the input $V_{in}$ may be allowed to have a valid input range that is substantially "rail-to-rail", which is to say it can span the entire power supply range of the analog to digital converter. In order to address the need for the input switch 6 to work reliably over such a wide range, a transmission gate or "TG" switch may be used, as shown in FIG. 3.

Figure 3:
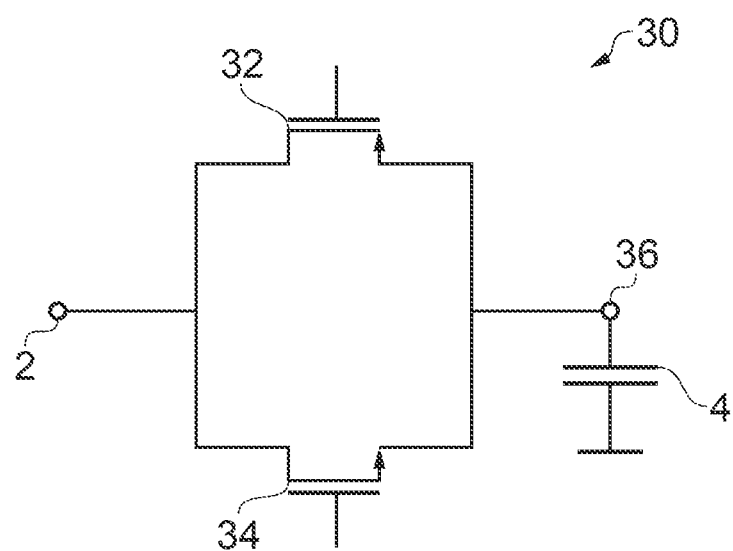
FIG. 3 is a circuit diagram of a transmission gate switch.

The "TG" switch, generally designated 30, in FIG. 3 comprises a PMOS transistor 32 in parallel with an NMOS transistor 34. When it is desired to make the switch conducting the gate of the PMOS transistor 32 is taken to 0V ($V_{ss}$) whereas the gate of the NMOS transistor 34 is taken to a suitable drive voltage, such as the positive supply voltage $V_{dd}$.

In use, because the sampling capacitor 4 is connected to an output node 36 of the TG switch, the voltages at nodes 2 and 36 are substantially the same. Therefore when a "high" input voltage ($V_{in}$ close to $V_{dd}$) is applied to the switch, there is little gate-source voltage across the NMOS transistor 34 and it is largely switched off. However, under such circumstances there is a good gate-source voltage across the PMOS transistor 32, and it fully conducting. Conversely, when a low ($V_{in}$ close to $V_{ss}$) input voltage is applied, there is little $V_{GS}$ across the PMOS device and it is switched off, but conversely the NMOS device 34 is driven hard on.

However, when the input voltage is mid range, both transistors may be conducting, but not to their lowest impedance state. Consequently the impedance of the TG switch may be at its largest "on" value. This problem is most prevalent where the supply voltage is low, say only a few volts.

Figure 4:
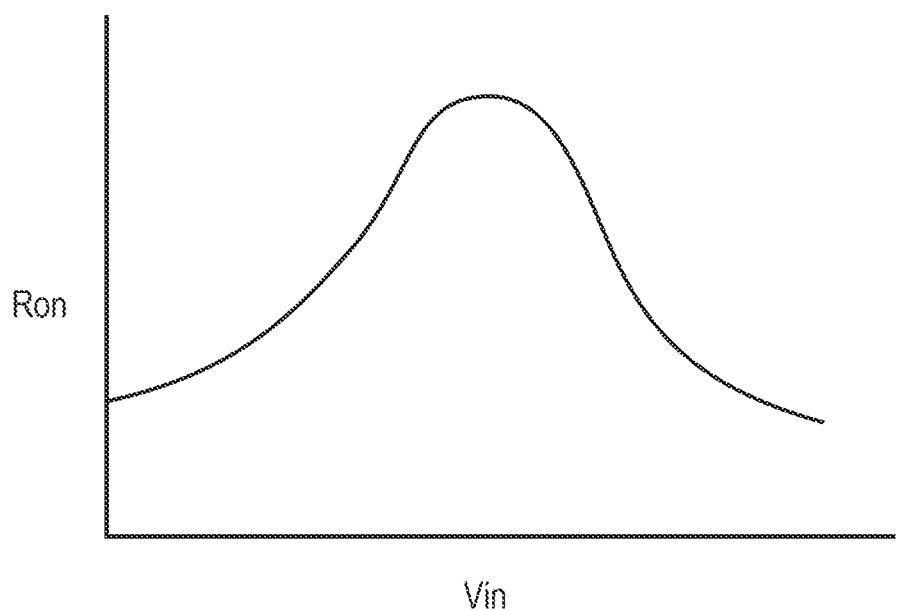
FIG. 4 is a graph showing how the impedance of the transmission gate switch of FIG. 3 varies with input voltage at an input node of the switch when the switch is in an "on" state.
Figure 5:
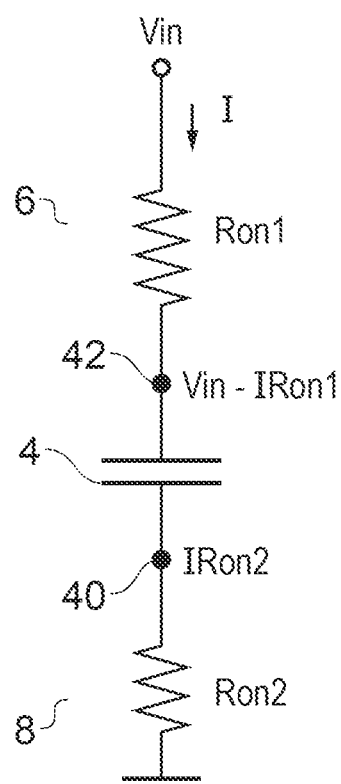
FIG. 5 is a circuit diagram showing impedances associated with a sampling capacitor in the sample and hold circuit of FIG. 2.

FIG. 4 schematically illustrates a variation of on resistance "$R_{on}$" versus input voltage $V_{in}$ for a TG switch Returning to FIG. 1 or 2, the sampling circuit can be redrawn as shown in FIG. 5 during the acquire phase, where the switches are represented in their on state as resistance $R_{on}1$ and $R_{on}2$.

During charging of the sampling capacitor 4, a current may flow which at a given time has a value of I. From this we can see that if $R_{on}2$ is small (say only a few ohms or 10 s of ohms) and I is small, because the sampling capacitor is relatively small (tens of pF) so as not to draw a large current from the input $V_{in}$, then the voltage at node 40 between the second plate of the sampling capacitor 4 and the second sampling switch 8 is always going to be close to or at 0 V. Thus the second sampling switch can reliably be switched to a minimum resistance value and hence the resistance of the second sampling switch 8 can be assumed to be invariant of $V_{in}$.

The voltage at node 42 between the first switch 6 and the first plate of the sampling capacitor 4 is substantially $V_{in}$, so the resistance of the first sampling switch may vary over a wide range (the range illustrated in FIG. 4) and hence the voltage dropped across the sampling switch of $IR_{on}1$ is a function of $V_{in}$ and can be considered as a error voltage E1, where $$E1 = I*R_{on}1(V_{in}) \quad \text{(equation 2)}$$

where I=charge current to the sampling capacitor
$R_{on}1(V_{in})$ is the resistance of $R_{on}1$ of the switch 6 which varies as a function of $V_{in}$.

Thus a small but unknown error voltage E1 may exist.

The output voltage $V_{out}$ of the sampling circuit of FIGS. 1, 2 and 5 can be approximated as $$V_o = V_{in} * \frac{\frac{1}{SC} + R_{on}2}{\frac{1}{SC} + R_{on}2 + R_{on}1(V_{in})} \quad \text{(equation 3)}$$

Where
S=J·2·π·F
J is the imaginary operator
F is the frequency in Hz
C is the capacitance of the sampling capacitor.

$V_O$ is equal to $V_{in}$ multiplied by a non-constant term that varies with $V_{in}$, so $V_{out}$ is distorted. Simulations where the sampling circuit is driven by a source having an output impedance of 200Ω, the sampling capacitor has a capacitance of 27 pF, the PMOS device was 144µ/0.5µ, the NMOS device was 95µ/0.5µ (NMOS devices are more conducting due to greater carrier mobility) resulted in an estimated total harmonic distortion (THD) of −77 dB (other device parameters need not be specified, and the above parameters are given so that examples of THD improvement can be discussed).

From the above discussion, it becomes evident that there are several distortion mechanisms that affect the gain of the sample and hold circuits of FIGS. 1 and 2.

Figure 6:
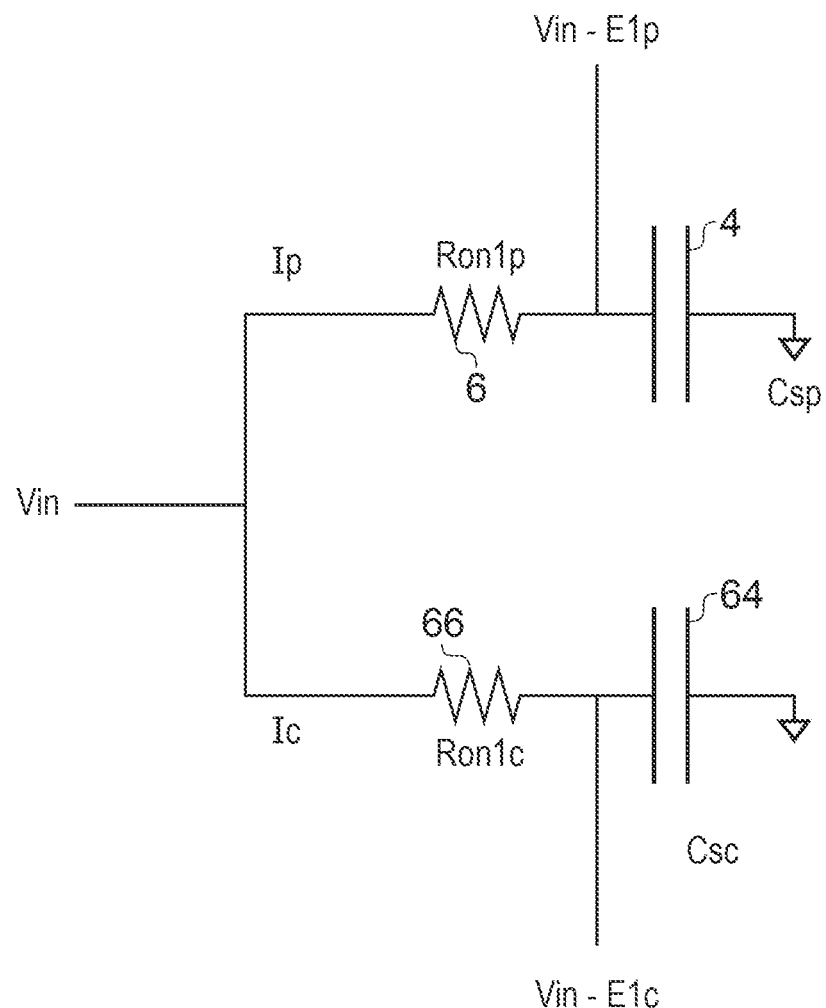
FIG. 6 is a schematic diagram showing current flow for first and second sampling capacitors connected to a common sampling node.

The applicant realised that the unknown error E1 may be estimated and/or removed by fabricating a second channel, which can be regarded as a compensation channel having a compensation channel sampling capacitor 64, as shown in FIG. 6, having a capacitance Csc. By contrast the capacitance in main or primary measurement channel of FIGS. 1, 2 and 5 has a capacitance Csp. The provision of a compensation channel may also enable some of the errors due to the parasitic non-linear capacitances to be reduced.

In an embodiment of the invention the capacitance Csp of the sampling capacitor 4 of the primary channel is N times larger than the capacitance Csc of the sampling capacitor 64 of the compensation channel, where N>1.

The compensation channel has first and second sampling switches equivalent to switches 6 and 8 of FIG. 2.

For the purpose of illustrating the invention only the on resistance of the first sampling switch 66 of the compensation channel is shown in FIG. 6 and considered here. It has a value $R_{on}1_c = M*R_{on}1p$ where $R_{on}1p$ is the on resistance of the switch 6, and $R_{on}1c$ is the resistance of switch 66. This can be achieved by making the transistors of the switch 6 M times wider than those of the switch 66 while keeping the channel lengths the same.

With the capacitors 4 and 64 of the main channel and the compensation channel, respectively, having different sizes, the currents flowing in the channels to charge the respective sampling capacitors are different. This gives rise to dissimilar voltage drops across the switches. The capacitors charge to very nearly the same voltages as each other, and it is reasonable to assume that the ratio of the currents follows the ratio of the capacitors. Consequently the error in the channels can be estimated, as will now be discussed.

If we consider the component of the error voltage due to current flow, then if the capacitance of the main channel capacitor 4 is N times the capacitance of the compensation channel, then the current flow $I_p$ in the main channel will be $NI_c$, or alternatively $$I_C = \frac{I_p}{N},$$

where $I_c$ is the current flow in the compensation channel.

If the resistance of $R_{on}1_c$ is $M*R_{on}1_p$ then we can compare the errors as $$E1_p = I_p * R_{on}1_p \quad \text{(equation 4)}$$

$$E1_c = I_p * \frac{M}{N} \times R_{on}1_p \quad \text{(equation 5)}$$

Thus the error voltages are related to each other in a known ratio determined by circuit parameters M and N.

It also follows that the voltage $V_1$ across the first sampling capacitor 4 is $$V_1 = V_{in} - (I_p * R_{on}1_p) \qquad \text{(equation 6)}$$

and the voltage $V_2$ across the sampling capacitor 64 in the compensation channel is $$V_2 = V_{in} - (I_p * R_{on}1_p)\frac{M}{N} \qquad \text{(equation 7)}$$

Although the voltages $V_1$ and $V_2$ are nearly the same because errors are very small, it is possible to process them to remove the error, or indeed to estimate the error.

Figure 7:
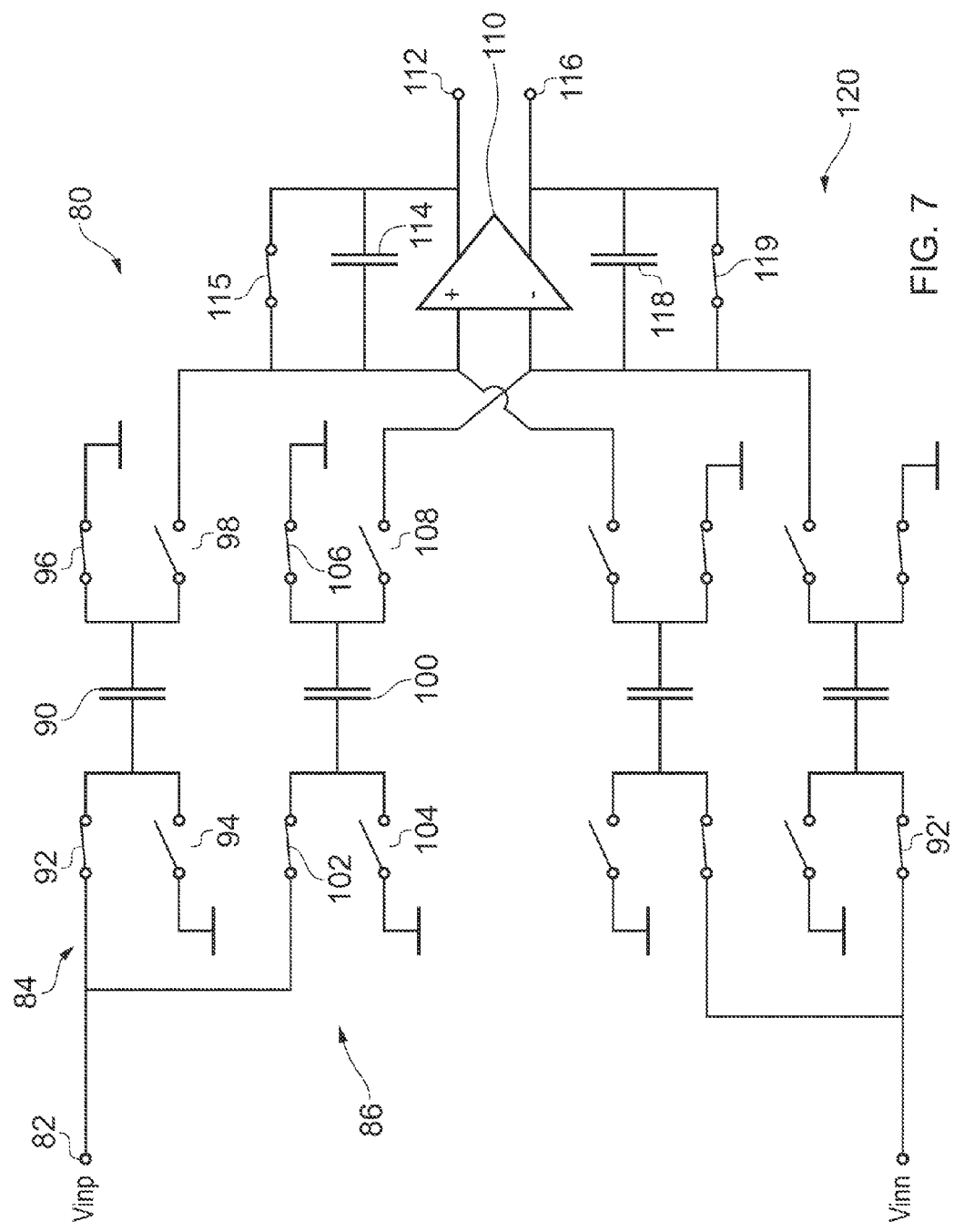
FIG. 7 is a current diagram of a sample circuit constituting an embodiment of the present invention.

This can be done in either the analog or digital domains. Processing in the analog domain can be performed by a modified sample and transfer circuit, as shown in FIG. 7. Thus the processing can be implemented relatively inexpensively without a significant increase in component count.

The circuit shown in FIG. 7 is a differential input sampling circuit comprising a first signal acquire and hold channel, generally designated 80, and a second acquire and hold signal channel generally designated 120.

The first signal channel 80 receives a first input $V_{in}P$ at an input node 82. The first input is provided to a first signal path which acts as a primary path generally designated 84, and to a second signal path that acts as a compensation path generally designated 86.

The primary path comprises a first sampling capacitor 90 in association with a switching network which comprises a first switch 92 between a first plate of the sampling capacitor 90 and the input node 82; a second switch 94 between the first plate of the sampling capacitor 90 and a local ground or bias (which may include a common mode voltage); a third switch 96 between a second plate of the sampling capacitor 90 and the local ground; and a fourth switch 98 between the second plate of the sampling capacitor and a non-inverting input of a charge transfer amplifier 110. The first switch is preferably a transmission gate as described with respect to FIG. 3 as this has an improved $R_{on}$ versus $V_{in}$ characteristic compared to a single FET switch. The switches 94 and 96 merely serve to connect one or other of the plates of the capacitor to a predictable reference voltage such as 0V, and can be implemented as single FET switches. Similarly the fourth switch 98 can also be implemented as a single transistor because its source is connected to ground by virtue of a virtual earth formed by the amplifier 110.

The compensation channel 86 comprises a sampling second capacitor 100 in combination with a switching network that comprises a fifth switch 102 between the input node 82 and a first plate of the sampling second capacitor 100; a sixth switch 104 between the first plate of the second sampling capacitor 100 and the local ground; a seventh switch 106 between a second plate of the second sampling capacitor 100 and the local ground and an eighth switch 108 between the second plate of the second sampling capacitor 100 and the inverting input of the charge transfer amplifier. The fifth switch functions as a second signal path transistor switch, and again may be formed as a transmission gate.

The charge transfer amplifier 110 is a differential amplifier having a first output 112. A first charge transfer capacitor 114 is connected between the first output 112 and the non-inverting input of the amplifier 110. A shorting switch 115 is provided in parallel with the first charge transfer capacitor 114.

The amplifier 110 also has a second output 116. A second charge transfer capacitor 118 is connected between the second output 116 and the inverting input of the amplifier 110. A shorting switch 119 is provided in parallel with the capacitor 118.

It is worth noting at this point, that the output voltage depends on the amount of charge transferred from the sampling capacitors 90 and 100. Thus, even though the capacitors 90 and 100 will have substantially the same voltage $V_{in}p$ across them after a sample phase, provided they have different capacitances so as to ensure that the amounts of sampled charge do not cancel the output from the amplifier 110 will be representative of, and proportional to (except for the error sources described herein), the input voltage. The same applies with respect to $V_{in}n$, so the output voltage is representative of $V_{in}p - V_{in}n$.

The second acquire and hold channel 120 is a mirror image of the first acquire and hold channel 80 and need not be described further.

During an acquire phase, as shown in FIG. 7, the first switch 92 is closed, the second switch 94 is open, the third switch 96 is closed, the fourth switch 98 is open, the fifth switch 102 is closed, the sixth switch 104 is open, the seventh switch 106 is closed, the eighth switch 108 is open and the shorting switch 115 is closed.

The corresponding switches in the second acquire and hold channel 120 are in corresponding states.

If we now consider the amount of charge transferred to the further capacitors 114 and 118, the charge from the primary channel of the first acquire and hold channel is $$(V_{in}p - I_p \cdot R_{onp}) \cdot C \qquad \text{(equation 8)}$$

where $R_{onp}$ is the switch resistance of the first switch 92, and C is the capacitance of the sampling capacitor 90.

Charge from the compensation channel of the first channel is $$-\left(V_{in}p - I_p \cdot R_{onp} \cdot \frac{M}{N}\right)\frac{C}{N} \qquad \text{(equation 9)}$$

Charge transferred from the primary channel of the second acquire and hold channel is $$-(V_{in}n - I_N R_{onn})C \qquad \text{(equation 10)}$$

where $R_{onn}$ is the switch resistance of the first switch 92 which is functionally equivalent to switch 92 of the first acquire and hold channel.

Charge transferred from the compensation channel of the second sample and hold channel is $$+\left(V_{in}n - I_n R_{onn}\frac{M}{N}\right)\frac{C}{N} \qquad \text{(equation 11)}$$

If we consider just the charge transfer due to the error voltages:

The error charge from the first acquire and hold channel is $$\left(-I_p \cdot R_{on} + I_p \cdot R_{onp} \cdot \frac{M}{N^2}\right)C \qquad \text{(equation 12)}$$

The error charge from the second sample and hold channel is $$\left(I_n \cdot R_{on} - I_n \cdot R_{onn} \cdot \frac{M}{N^2}\right)C \qquad \text{(equation 13)}$$

where $I_p$ is the current in the first channel and $I_n$ is the current in the second channel. It can be seen that, in each channel, if $M=N^2$ then the error charge cancels.

Meanwhile, the charge from the signal is:
In the first channel $$V_p C - V_p \frac{C}{N} \qquad \text{(equation 14)}$$

and in the second channel $$-V_n C + V_n \frac{C}{N} \qquad \text{(equation 15)}$$

which is $$(V_p - V_n)\left(1 - \frac{1}{N}\right) \cdot C \qquad \text{(equation 16)}$$

So the signal remains (although is attenuated by $$\left(1 - \frac{1}{N}\right)$$

provided $N \neq 1$.

Figure 8:
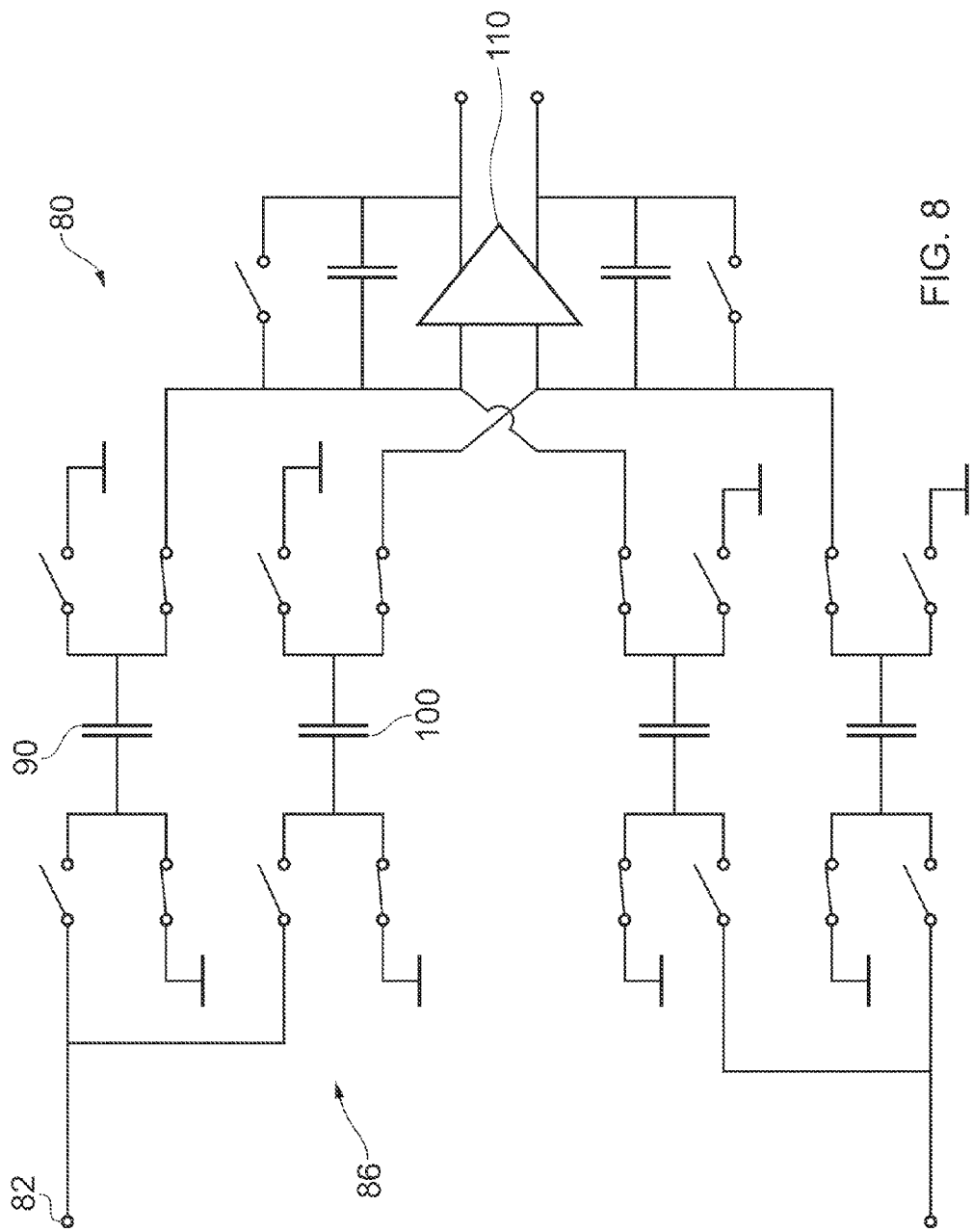
FIG. 8 shows the circuit of FIG. 7 in a charge transfer configuration.

The circuit configuration for charge transfer is shown in FIG. 8, where all the switches that were closed are opened, and then all the switches that were open are closed, in a break before make manner.

Thus, the compensation for switch resistance can be done in the analog domain by the inclusion of compensation channels in the sample and transfer circuit that was already instantiated within a sampling network.

It is possible that, in embodiments of the invention, the capacitance of the transistors in the TG switches may not be negligible compared to the capacitance of the sampling capacitor(s). This gives rise to currents required to charge or discharge these parasitic components, which give rise to small additional error voltages E2.

Although the circuit in FIG. 7 has been shown as a fully differential circuit, a single ended version can be fabricated by connecting the second sample and hold channel input to ground, or by omitting the second sample and hold channel completely.

Furthermore, in an embodiment the capacitors may be selected such that the first and second sampling capacitors are the same size such that an error voltage due to the switch resistance is calculated, and which may be used to generate or apply a correction.

Figure 9:
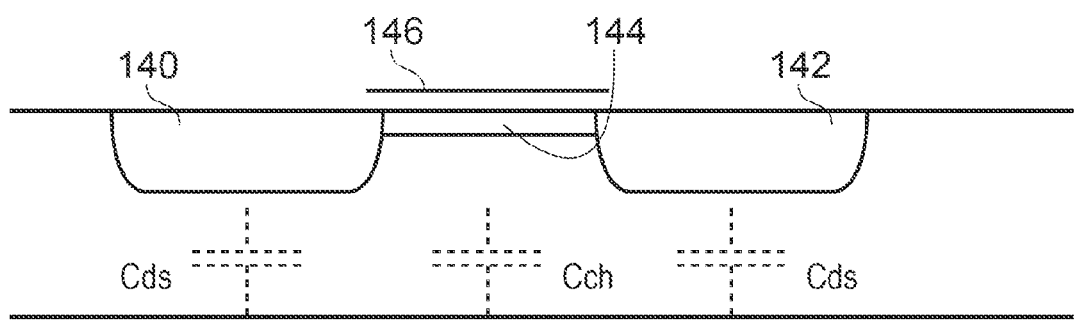
FIG. 9 is a cross section through a field effect transistor notionally indicating the presence of parasitic capacitors.

FIG. 9 is a cross section through a field effect transistor which will be used to discuss the contribution from parasitic components. The transistor shown in FIG. 9 comprises a doped region 140 which forms a drain, a doped region 142 which forms a source, and a channel 144 extending between the drain and the source in a region beneath a gate 146. For simplicity it will be assumed that the parasitic capacitance between the drain and the body of the device is the same as the capacitance between the source and the body of the device, and can be represented as $C_{ds}$.

The capacitance between the channel 144 and the substrate in which the transistor is formed, and between the channel and the gate electrode adjacent but isolated from the channel can be represented as $C_{ch}$. However, for simplicity the channel capacitance can be shared equally between the drain and the source.

These capacitances can change the effective capacitance ratios between the first and second signal paths.

One way to overcome this may be to estimate the additional capacitance through modelling and to deliberately change the ratio of the sampling capacitors in order to provide cancellation. Such an approach may not scale between different device geometries, and hence each correction may need to be calculated ab-initio for a geometry change.

However, this problem can be alleviated or avoided by suitable switch design.

The inventors realised that forming the transistors as shared channel devices can manipulate the parasitic capacitances in such a way that they are substantially compensated for.

Figure 10:
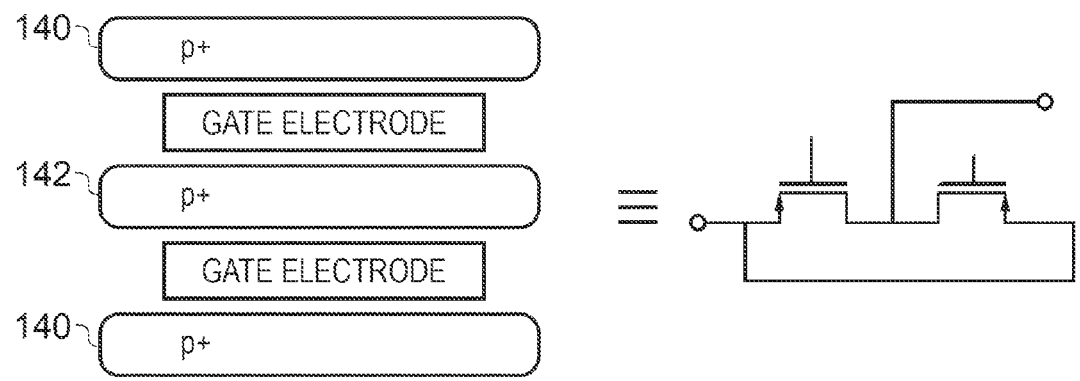
FIG. 10 is a plan view of transistors forming part of a transmission gate in accordance with an aspect of the invention.

The main channel transistors, e.g. those of the first signal path, may advantageously be formed as parallel transistors with a common channel. Thus, for example, the PMOS transistor 32 of the TG switch (FIG. 3) used to form the switches can be formed by two transistors in parallel, but sharing a common drain or a common source as shown in FIG. 10. Thus, the drain diffusion used to form the devices is common to both transistors.

Figure 11:
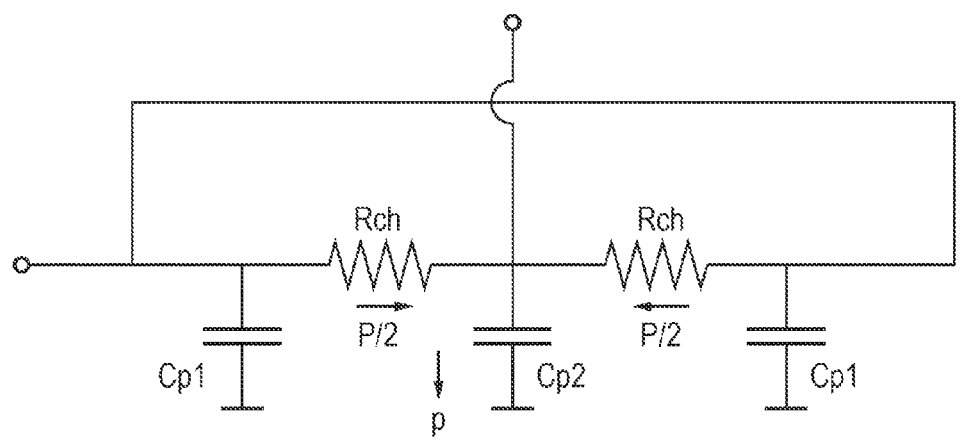
FIG. 11 is an equivalent circuit for the arrangement shown in FIG. 10.

An equivalent circuit for such a device, and the parasitic current P flowing only to the parasitic capacitors, is shown in FIG. 11.

The parasitic capacitances of the two stripe (parallel transistors) switch of FIG. 10 are represented as $C_{p1}$ and $C_{p2}$. The capacitances $C_{p1}$ are directly charged from the input node and hence do not give rise to the additional error E2, although they do continue to present an additional capacitive load on the input.

The parasitic capacitance $C_{p1}$ receives its current through each transistor, which here is represented by a resistance $R_{ch}$ to indicate the resistance of the conducting channel between the drain and source of each transistor.

The capacitance $C_{p2}$ can be related to the individual parasitic capacitances for a transistor as shown in FIG. 9

$$C_{p2} = C_{ds} + \left(2 * \frac{1}{2} C_{ch}\right) \qquad \text{(equation 17)}$$

and the additional error voltage E2 due to the current P required to charge $C_{p2}$ is $$E2_{(main)} = \frac{1}{2} \cdot P \cdot R_{ch} \qquad \text{(equation 18)}$$

To reduce, and preferably minimise, this error E2 in the compensation channel should scale by the same ratio as the ratio N by which the capacitors are scaled.

A way to achieve this is to form the switches in the compensation channel as a parallel combination of groups of series connected devices.

Figure 12:
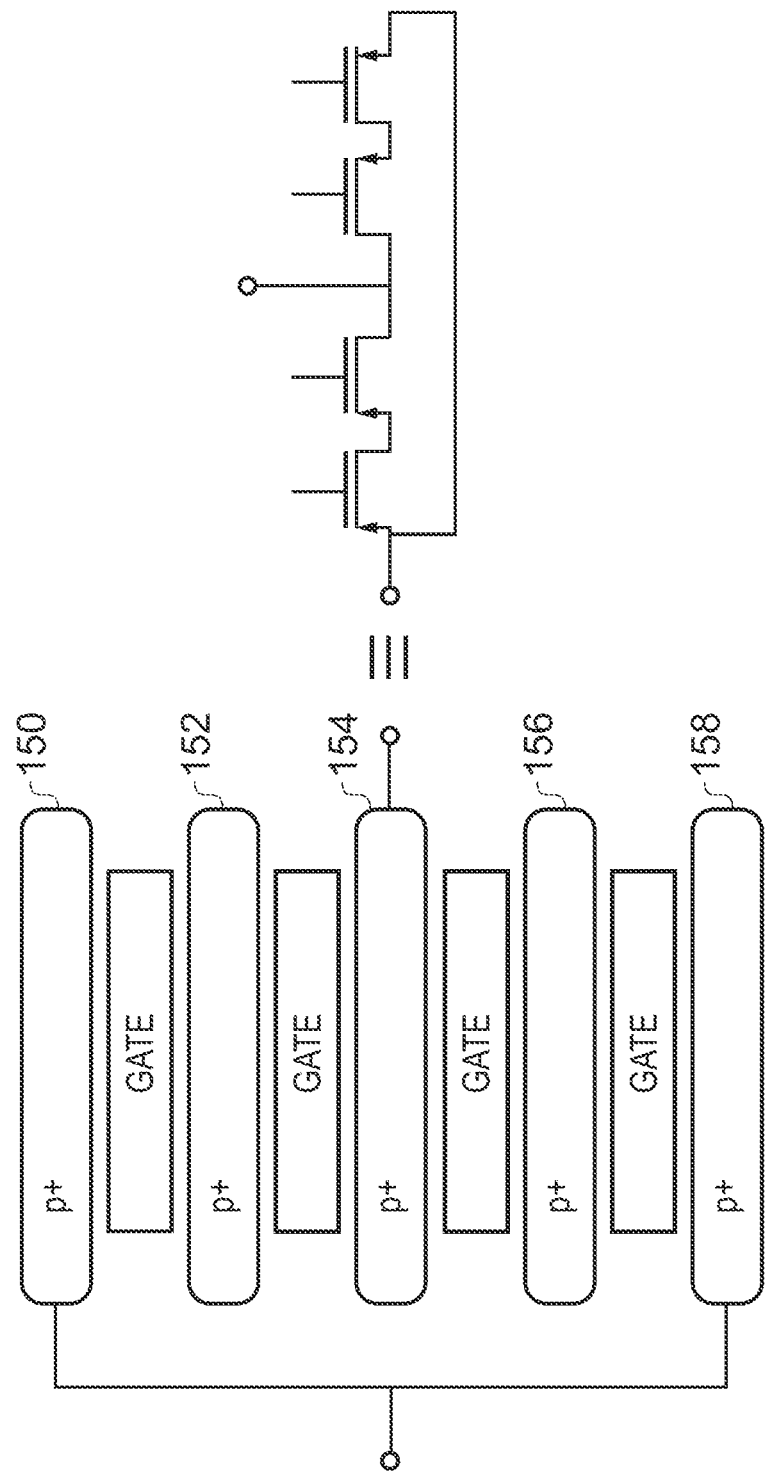
FIG. 12 is a plan view of transistors forming part of a further transmission gate in accordance with an aspect of the invention.

Such an arrangement is shown in FIG. 12.

Here P type regions 150, 152, 154, 156 and 158 are arranged in a row on the surface of a substrate. Regions 150 and 152 have a gate formed between them and cooperate to form a PMOS FET. However regions 152 and 154 also cooperate to form a second PMOS FET in series with the first FET. Similarly regions 154 and 156 cooperate to form a FET, as do regions 156 and 158. Thus four FETs are formed in series, but they share common doped regions. The regions 150 and 158 are connected to each other to form commonly connected source terminals and region 154 acts as a shared drain.

Figure 13:
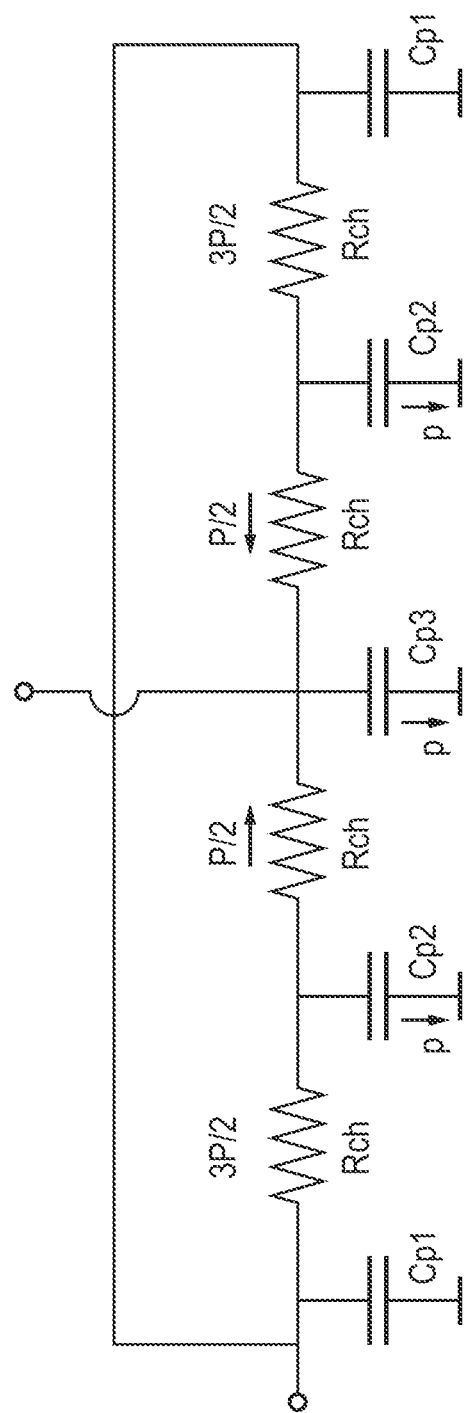
FIG. 13 is an equivalent circuit for the arrangement shown in FIG. 12.

An equivalent circuit showing channel resistances and parasitic capacitances $C_{p1}$, $C_{p2}$ and $C_{p3}$ is shown in FIG. 13.

By looking at the structure of the device, in conjunction with FIG. 9, it can be seen that $C_{p2}=C_{p3}$, and that this is equal to $$C_{ds} + \left(2 * \frac{1}{2} C_{ch}\right). \quad \text{(equation 19)}$$

This is the same parasitic value as was found for $C_{p2}$ in FIG. 11. However, from inspection of the current flows it can be seen that the error E2 resulting from current flow to charge the parasitic capacitances $C_{p2}$ and $C_{p3}$ is given by $$E2 \text{ (compensation channel)} = \frac{3}{2} P \cdot R_{ch} + \frac{1}{2} P \cdot R_{ch} = 2PR_{ch} \quad \text{(equation 20)}$$

E2 in the compensation channel is thus four times larger than E2 in the main channel giving an ideal value of N of 4.

More devices, i.e. 3, 4 or more can be placed in series and parallel as described above to give ideal values of N of 9 and 16, respectively.

Figure 14A:
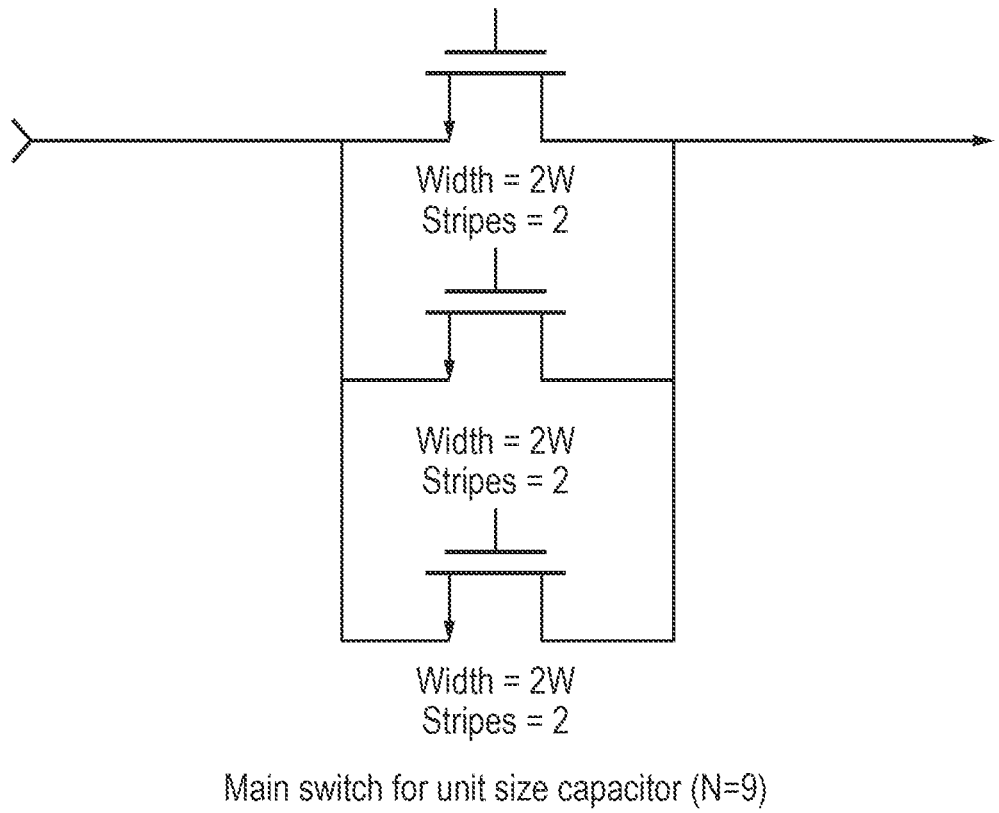
FIGS. 14a and 14b illustrate further switch configurations for compensating for parasitic capacitance.
Figure 14B:
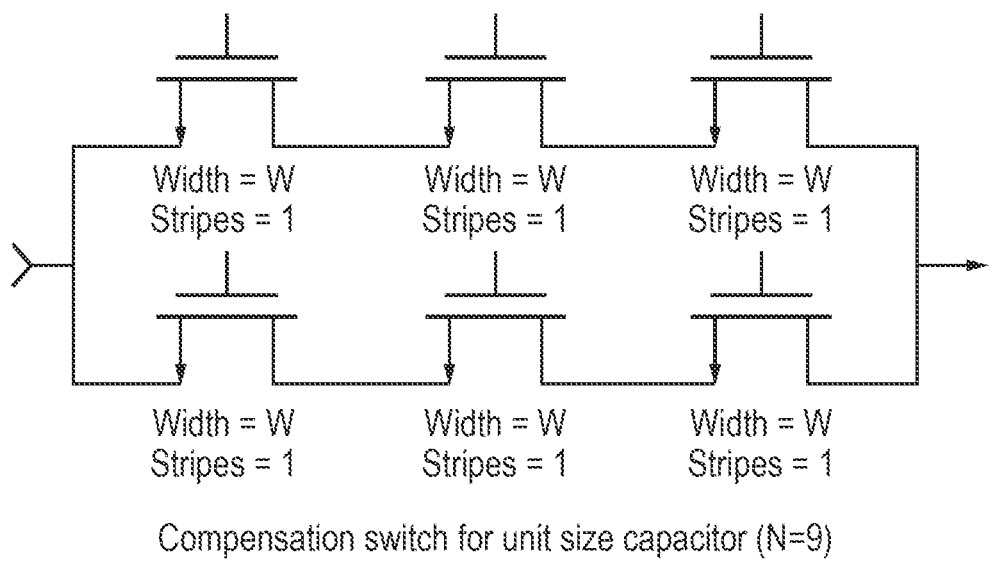

FIGS. 14*a* and 14*b* schematically show main and compensation channel input switches, respectively, for the case where N=9 and the effect of parasitic capacitances as described hereinbefore with respect to FIGS. 10 to 13 have been minimised by forming transistors having shared implanted regions. Simple analysis shows that the impedance across the compensation channel is nine times greater than across the main channel for the devices having the widths and stripes (i.e. number of devices having a shared channel illustrated in the Figures). In general $\sqrt{N}$ such devices are placed in the main channel in parallel, and $\sqrt{N}$ devices are placed in series in the compensation channel.

Figure 15:
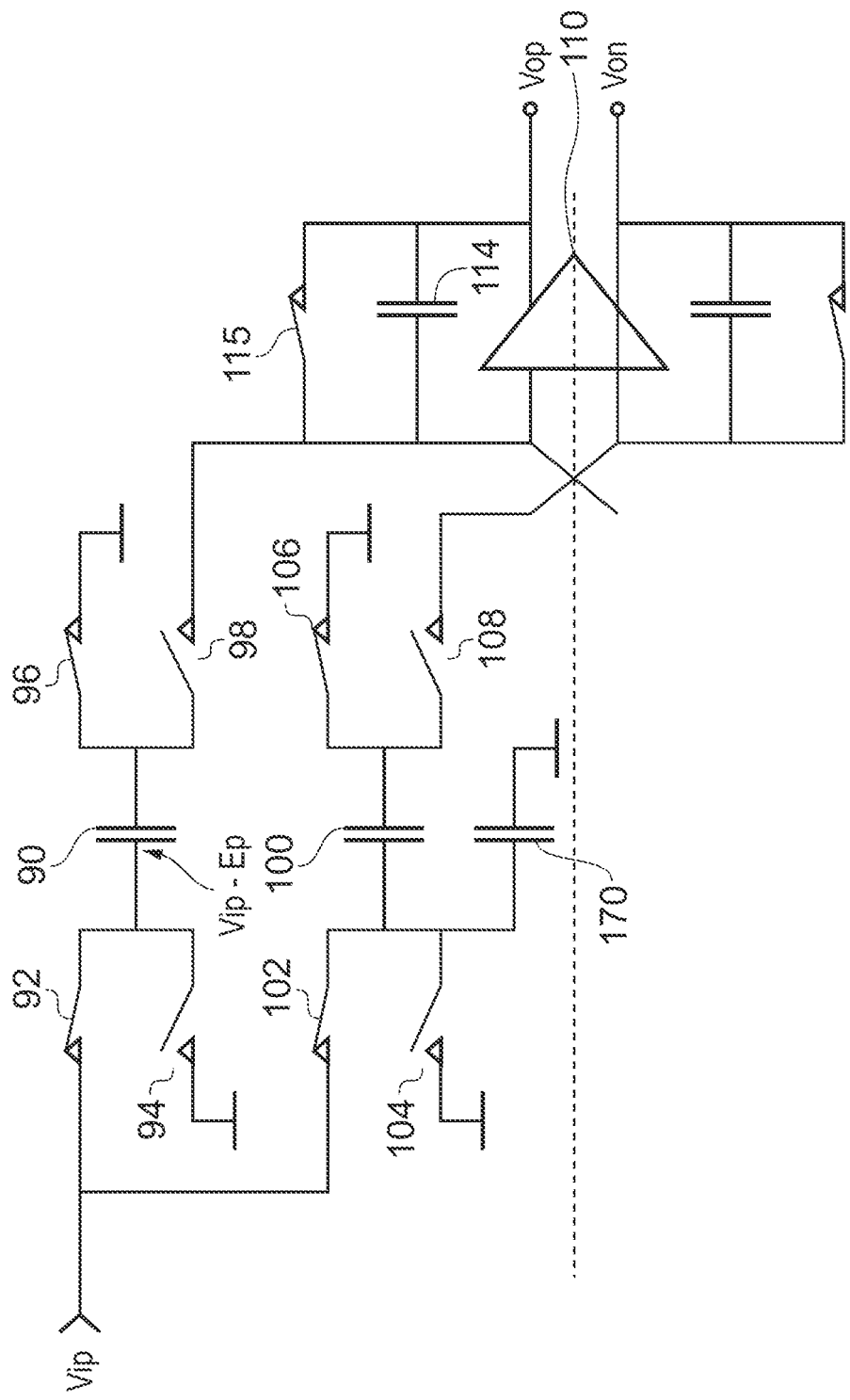
FIG. 15 is a circuit diagram for a sample circuit constituting a further embodiment of the invention.

FIG. 15 shows a variation to the sampling circuit where an additional capacitive load implemented as capacitor 170 has been added to increase the loading on switch 102 during sampling. Thus, if capacitor 170 is selected such that the total capacitive load in the compensation channel is now the same as that in the main channel, then switch 102 now need only be sized to have an on resistance that is N times larger than that of switch 92. Thus, if capacitor 100 has a value of 1C, and capacitor 90 has a value of NC, then capacitor 170 has, in this example, a value of (N−1)C. The additional capacitor 170 can be selected to have other values and the transistors in the switch 102 can be scaled as appropriate.

It is often convenient for semiconductor circuit manufacturers to work in terms of components having a unit size. Thus for example, a manufacturer may have a process where capacitors are formed in blocks of C or multiples thereof. This means that actual circuits as implemented may differ from the circuits as discussed hereinbefore. This will be discussed with respect to FIGS. 16*a* and 16*b*.

Figure 16:
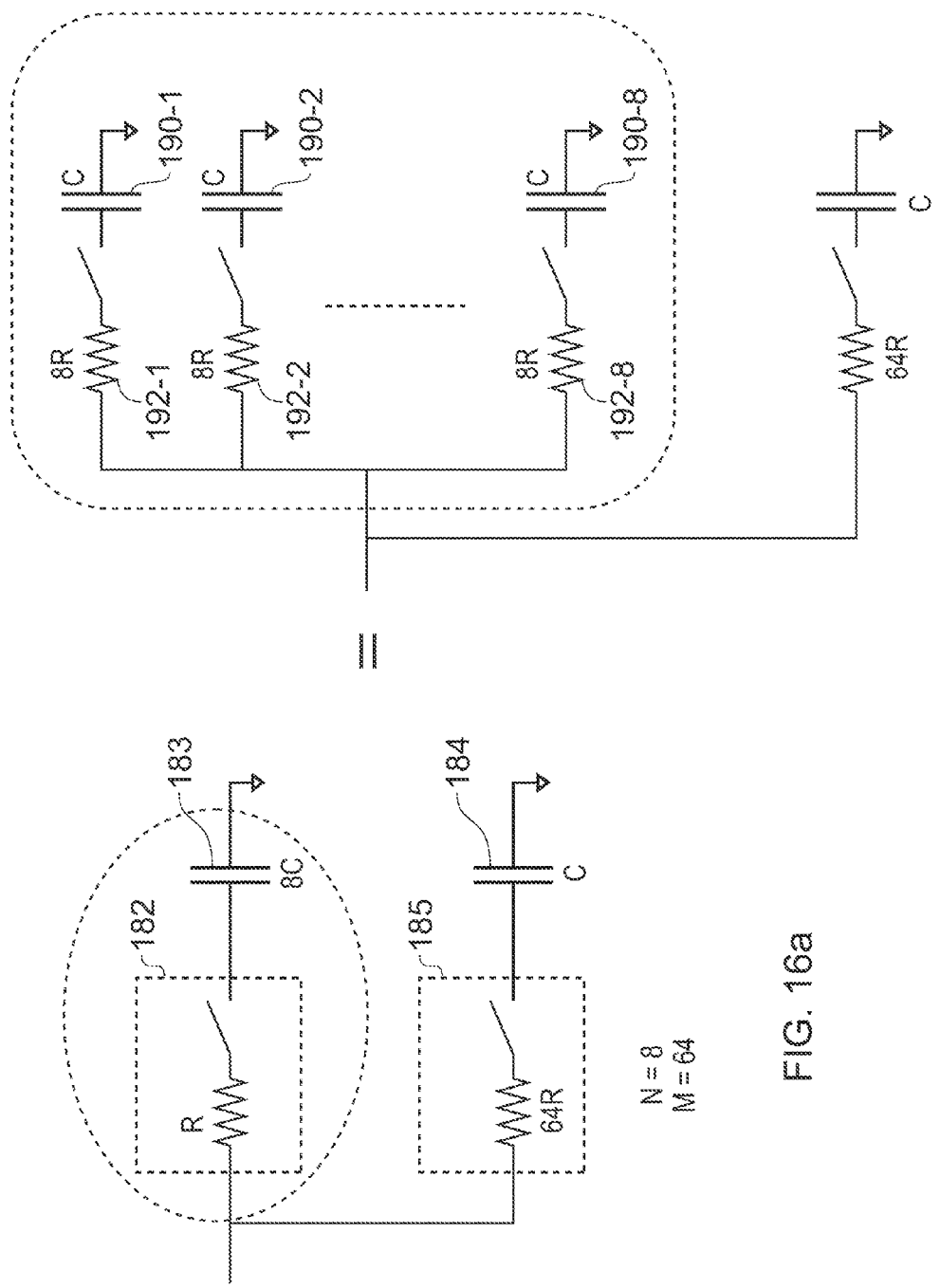
FIGS. 16a and 16b show equivalent instantiations of a sampling circuit.

FIG. 16*a* shows, in simplified form, the input stage for the circuit shown in FIG. 7 for N=8 and M=64. If the unit switches have a nominal on value of R and unit capacitors have a nominal value of C, then the sampling switch in the primary channel can be represented as an ideal switch in series with a resistance R, as enclosed by block 182. The capacitor in the primary channel 183, has a value of 8C. The capacitor 184 in the compensation channel has a value of C, and the sample switch in compensation channel can be represented by an ideal switch 187 series with a resistor having a value of 64R, as shown by block 185.

The circuit can be fabricated as shown in FIG. 16*b* where the capacitor 183 is formed as 8 parallel unit capacitors 190-1 to 190-8. As the capacitors are in parallel, the capacitances sum to 8C. Each capacitor 190-1 to 190-8 can have a respective switch 192-1 to 192-8. These switches are in parallel with each other, and their equivalent resistance must equal R. It therefore follows that each switch should have an equivalent resistance of 8R.

Figure 17:
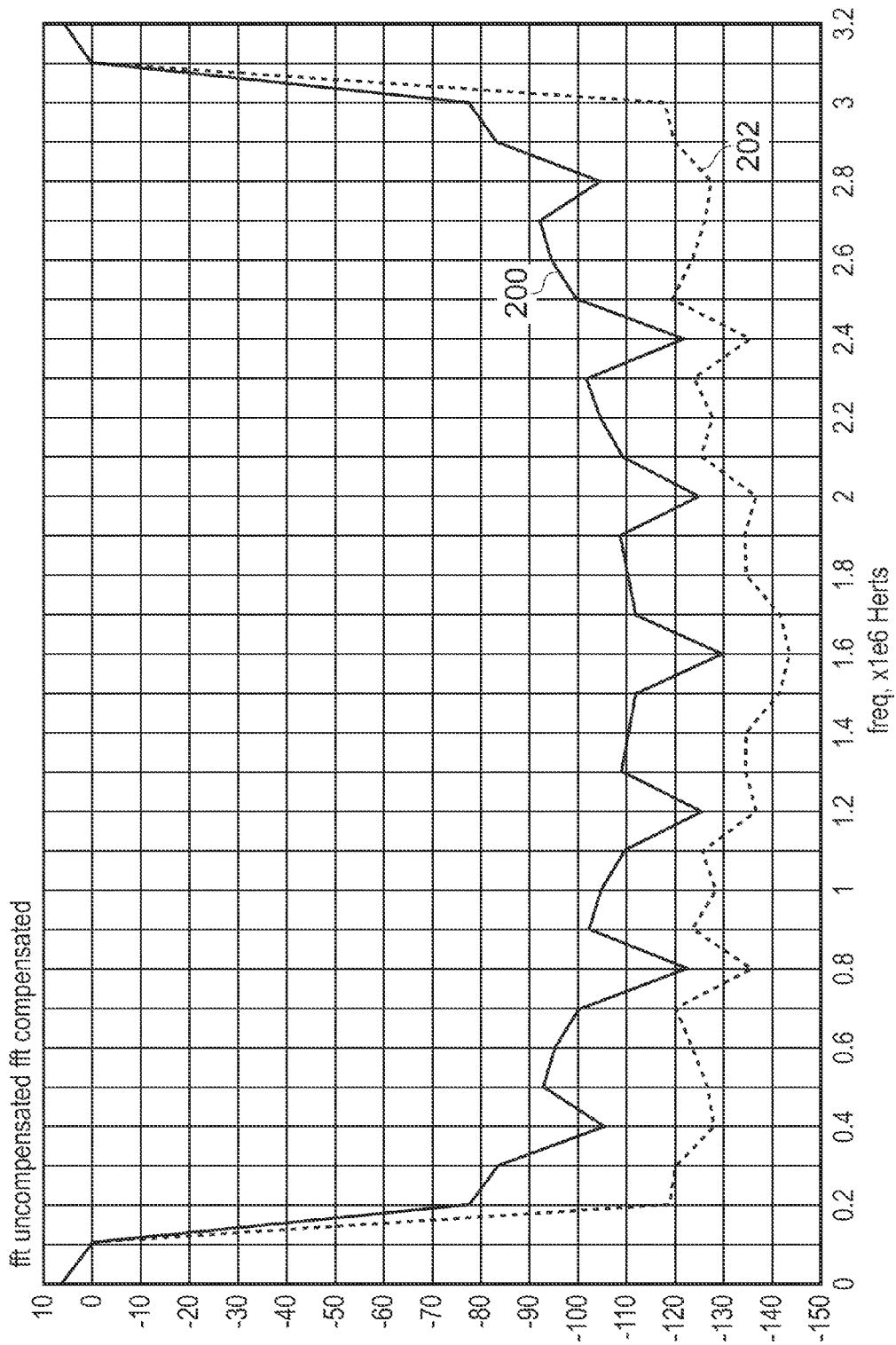
FIG. 17 is a graph of simulated frequency versus frequency response for the circuit of FIG. 7 versus that of FIG. 2.

FIG. 17 illustrates a simulated Fourier transform of the performance of the sample and hold circuit of FIG. 7 both with and without the inclusion of the compensation channel. In FIG. 7, the transmission gate switch is simulated as a 144 micron by 0.5 micron PMOS device in parallel with a 95 micron by 0.5 micron NMOS device driven from a source having an impedance of 200 ohms, and driving a 27 pF sampling capacitor. The uncompensated simulation is shown by line 200, and the compensated simulation by line 202. In the simulation the compensation has improved the total harmonic distortion from −77 decibels to −107 decibels. One artefact of this improvement is that for a target THD figure the transmission gate switch can be made from smaller transistors. Smaller, in this context, can mean considerably smaller and prior art transmission gate switches from the applicant have involved PMOS transistors having a size of 3000 microns by 0.6 microns and NMOS having a size of 1000 by 0.6 microns.

Figure 18:
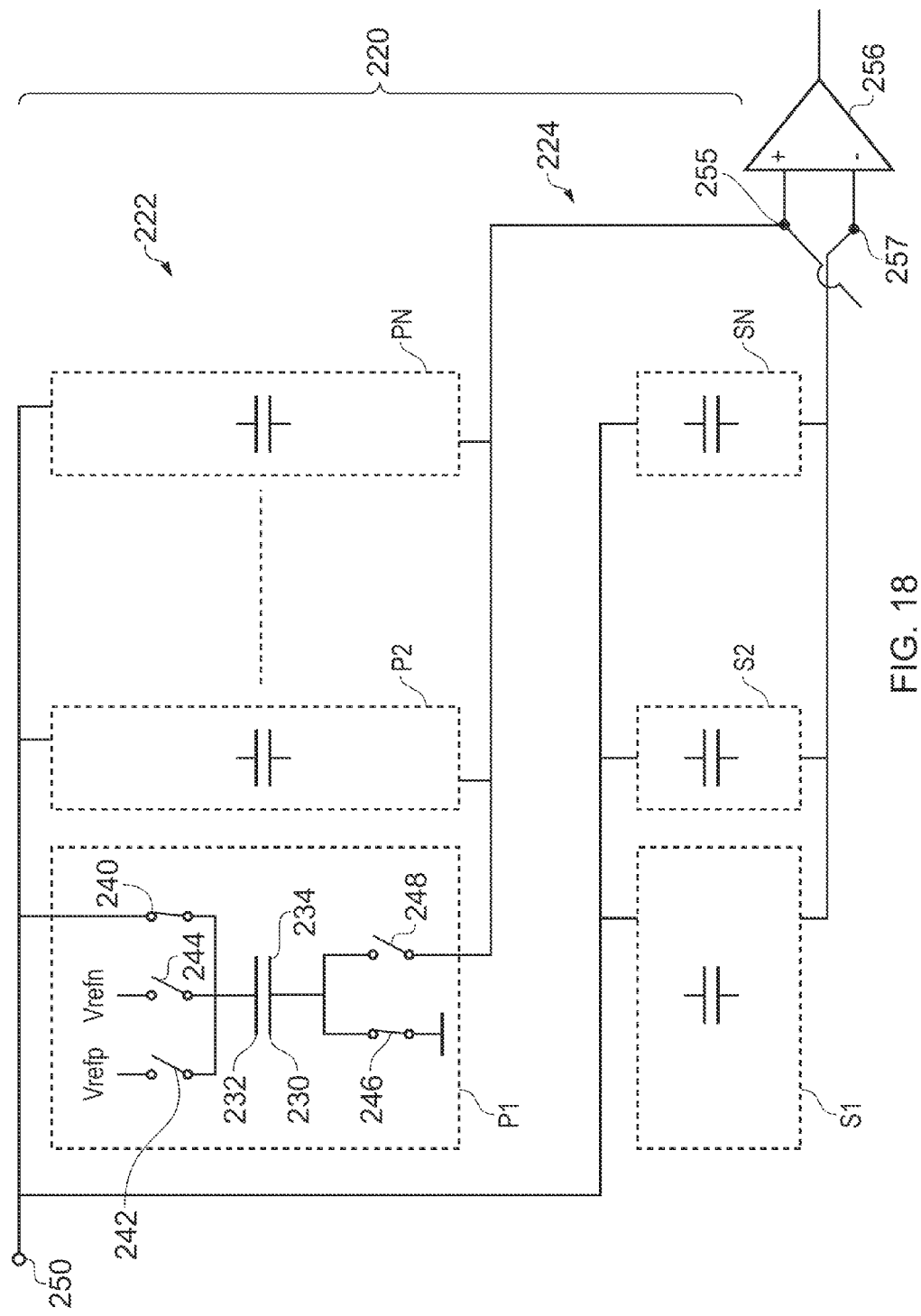
FIG. 18 is a circuit diagram of a SAR converter incorporating a sampling circuit in accordance with the present invention.

FIG. 18 shows a SAR converter constituting an embodiment of the invention. Only a first channel 220 of the sampling circuit is shown in detail, and it comprises a primary or main path designated 222 and a second or compensation path designated 224. An equivalent second channel is provided which is a mirror image of the first channel.

The primary path comprises first to Nth capacitor and switch blocks, P1 to PN. The compensation path comprises equivalent capacitor and switch blocks S1 to SN which have a similar internal arrangement, but where the capacitor values and switch resistances have been scaled with respect to one another.

The structure of the first capacitor and switch block will now be described. The block P1 comprises a capacitor 230 having a first plate 232 and a second plate 234. The capacitor 230 is associated with five switches 240, 242, 244, 246 and 248. A first of these switches 240 acts as a first sampling switch to connect the first plate 232 of the capacitor 230 to a non-inverting input node 250. A second switch 242 is operable to connect the first plate 232 to a first reference voltage Vrefp, and a third switch 244 is operable to connect to the first plate 232 to a second reference voltage Vrefn.

The fourth switch 246 is operable to connect the second plate 234 of the capacitor 230 to ground, and the fifth switch is operable to connect the second plate of the capacitor 230 to an output node 255, to which the non-inverting input of a comparator 256 is connected.

The capacitor "weights" or sizes in each block are scaled. Normally this would be a binary weighting with the capacitor of block P1 being twice the capacitance of the capacitor of block P2, four times the capacitance of capacitor in block P3 and so on.

However, with the inclusion of the capacitor blocks S1 to SN in the compensation path this needs modification because the fifth switch of the capacitor blocks S1 to SN connects to a further output node 257 which is connected to the inverting input of the comparator 256.

In use, during sampling the signal from the non-inverting input node 250 is sampled onto the capacitors of the blocks P1 to PN in the primary path and the capacitors of the blocks S1 to SN in the secondary or compensation path. However, if we consider just the blocks P1 and S1 the charge sampled by S1 is effectively subtracted from the charge sampled by P1 (by virtue of their respective connections to the comparator 256) once the successive approximation routine conversion process starts.

As a result, the relative weights of the sum of capacitances of blocks P1 and S1 need to scale with respect the relative weights or sizes of the sum of the capacitances of blocks P2 and S2, and so on.

In this embodiment, we assume that only 8 capacitors are involved in sampling the input signal, for example because the SAR converter is formed using a segmented switched capacitor array which, as known to the person skilled in the art, reduces the scaling requirements between most significant bit capacitor and the least significant bit capacitor.

FIG. 19 is a table showing relative capacitor values for a relatively simple switched capacitor array, as shown in FIG. 18. Thus for simplicity the primary array is assumed to have eight stages P1 to P8. P8 represents the least significant bit in this example, and hence can be assumed to have a capacitance of C. Hence stage P7 should have a value 2C, P6 should have a value of 4C and so on. However, as is also known to the person skilled in the art of SAR analog to digital converter design, performance can be improved by the inclusion of the additional bits or weights within the converter as these provide the ability to recover from an incorrect bit trial decision. Thus P5 and P4 have both been given the same weight of nominally 8C, and then the power of two weight sequence continues up to PN=1 which would be expected to have a weight of 64C.

However, the capacitors in the compensation channel provide a charge which is effectively subtracted from the equivalent capacitor of the primary channel.

Earlier on it was shown that the error resulting from finite switch resistance could be cancelled completely when $M=N^2$.

We may choose to restrict ourselves to the integer solutions of this and pick N=16.

Thus, at a first pass, the values of the capacitors in channels S1 to S8 should be one sixteenth of corresponding channel P1 to P8.

This would give: S1=4, S2=2, S3=1, S4=S5=½, S6=¼, S7=⅛, S8=1/16. However, some of these capacitors are relatively small and the error that non-zero switch resistance introduces also becomes relatively small. Thus these weights could be ignored, or better still the sub unity values (which sum to nearly 1) can be added to some of the more significant value capacitors, in this case S4 and S5 to make them both 1C.

These signals sampled onto the compensation channel capacitors are effectively subtracted from the signal on the corresponding main channel capacitor. This would reduce the scaling between adjacent stages from radix=2 to radix less than two. This is in fact acceptable as radix<2 converters are known as a technique for introducing error correction into SAR converters. However, the power of two scaling between adjacent stages can be reintroduced by adding the value of the compensation channel capacitor to the value of the corresponding capacitor in the main channel. Thus, stage P1 becomes 64+4=68C such that, taking the subtraction of 4C from the compensation channel into account, the effective net weight of the first stage P1−S1=64C. Similarly stage P2 has a value of 32+2=34C, such that the net weight of the second stage P2−S2=32. Similarly P3−S3=16, P4−S4=8, and for the redundant bit P5−S5 also =8. The compensation capacitors for stages 6 to 8 were not formed in this example so stages S6 to S8 scale in the expected power of two sequence 4, 2, 1.

It can also be seen that by oversizing the values of the capacitors in blocks S4 and S5, the sum of capacitors in blocks S4 and S5, the sum of capacitance in the compensation channel of 9C scales by 16 to the sum of capacitance in the main channel of 144C. Furthermore, the attenuation in the signal at the comparator inputs can be reduced if the switches for the compensation capacitors in blocks S1 to SN are set as the bit trials and conversion progresses in accordance with the switch selections of the corresponding blocks P1 to PN of the primary channel.

Figures 20, 21:
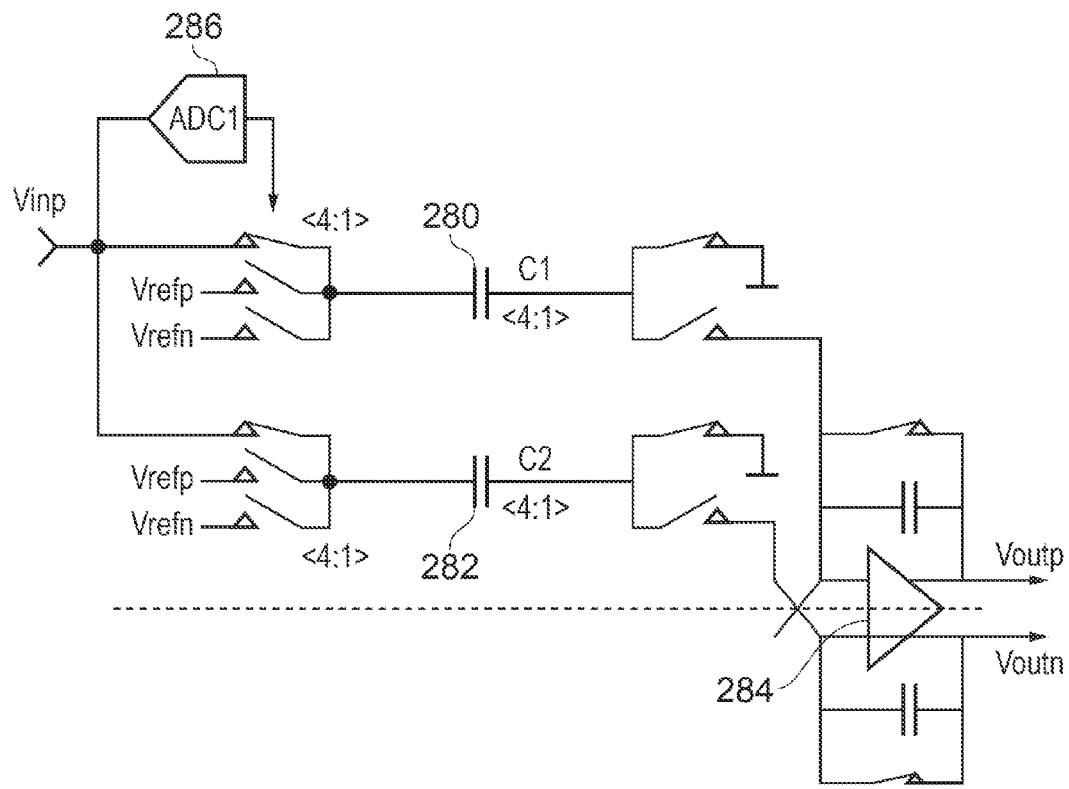
FIG. 20 is a circuit diagram of a pipeline ADC having a sampling circuit in accordance with the present invention.
FIG. 21 is a table showing capacitor weights for four bit conversions within a single stage of the pipeline.

FIG. 20 shows an example of the first stage of a pipeline converter using the switch resistance compensation technique described herein and where the relative values between the capacitor(s) in the primary channel and the capacitor(s) in the compensation channel for each stage of the converter has been selected such that N=9. Thus, in the first stage of the pipeline converter the value of a capacitor 280 in the primary channel is selected to be nine times the value of the capacitor 282 in the compensation channel. A single stage of a pipeline converter can convert a plurality of bits. In this example the stage can convert 4 bits at a time, and thus the primary channel capacitor 280 is actually 4 capacitors in parallel, as represented by "<4:1>", with each capacitor having respective input switches, again as represented by the "<4:1>" notation. Each of the $V_{refp}$ and $V_{refn}$ switches can be driven independently for each of the capacitors 280 in response to ADC 286.

The compensation channel is similarly configured.

As before the weights in the compensation channel are scaled in a power of two sequence of 8, 4, 2, 1C from the most significant bit to least significant bit within the stage, respectively. The scaling between the primary and compensation channel capacitor sizes, and the correct net scaling between each of the four bit valves in the pipeline can be achieved for N=9 by making the weights of the capacitors in the primary channel 64+8, 32+4, 16+2, 8+1 respectively such that each capacitor in the primary channel is nine times the size of the corresponding capacitor in the compensation channel, and, as shown in FIG. 21, the net weight sequence is binary weighted at 64C, 32C, 16C and 8C from most significant bit to least significant bit within the stage.

Amplifier 284 acts to form a residue, representing a difference between the analog value at the input to the converter and the digital approximation of the input value derived by the ADC so far, for presentation to the next stage of the pipeline.

Figure 22:
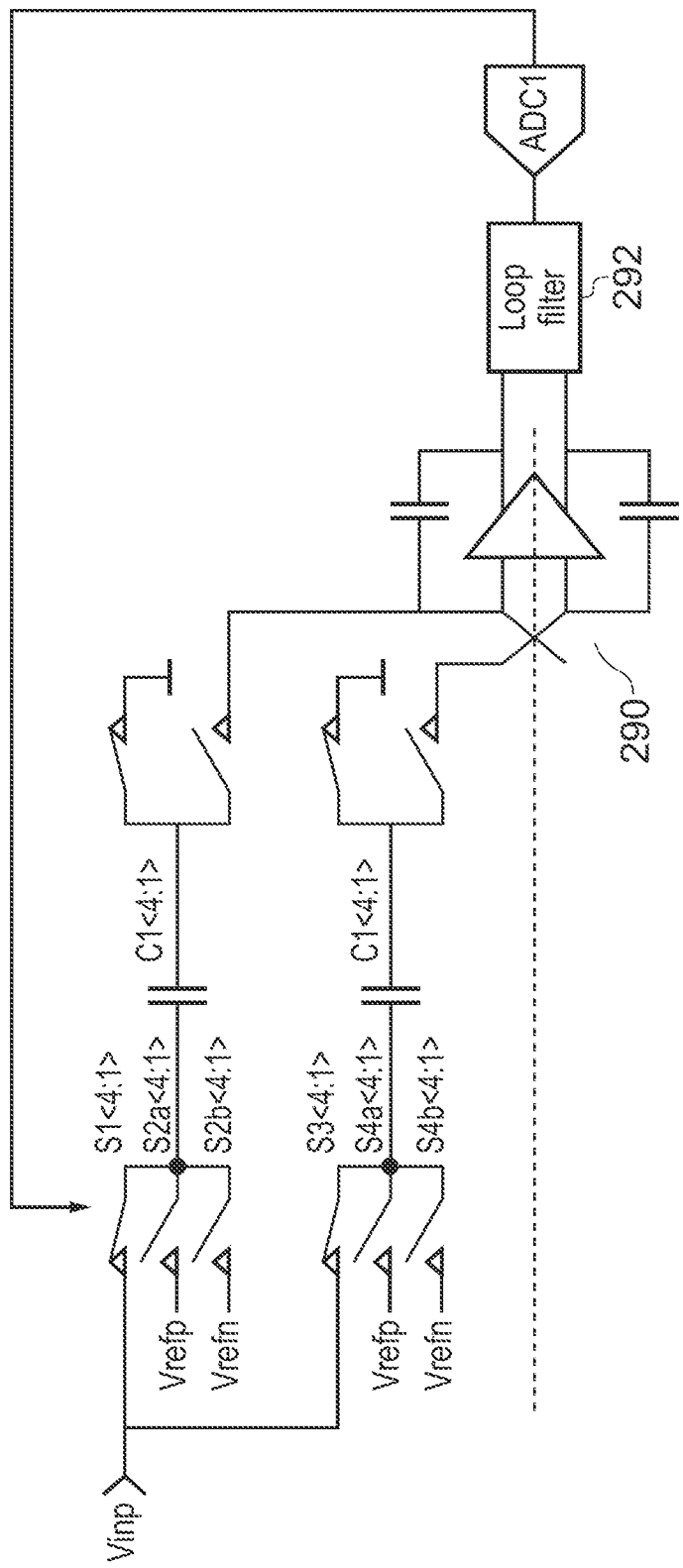
FIG. 22 is a circuit diagram for a delta-sigma ADC having as input circuit in accordance with the present invention.

FIG. 22 is in many ways similar to that of the pipeline example of FIG. 20, except that the amplifier 284 has been turned into an integrator 290 and the converter ADC1 has been moved to the output of the loop filter 292 so as to form a delta-sigma ADC. Otherwise the relative scalings between the capacitors and the resistances of the switches follow the sequences as previously discussed.

Figure 23:
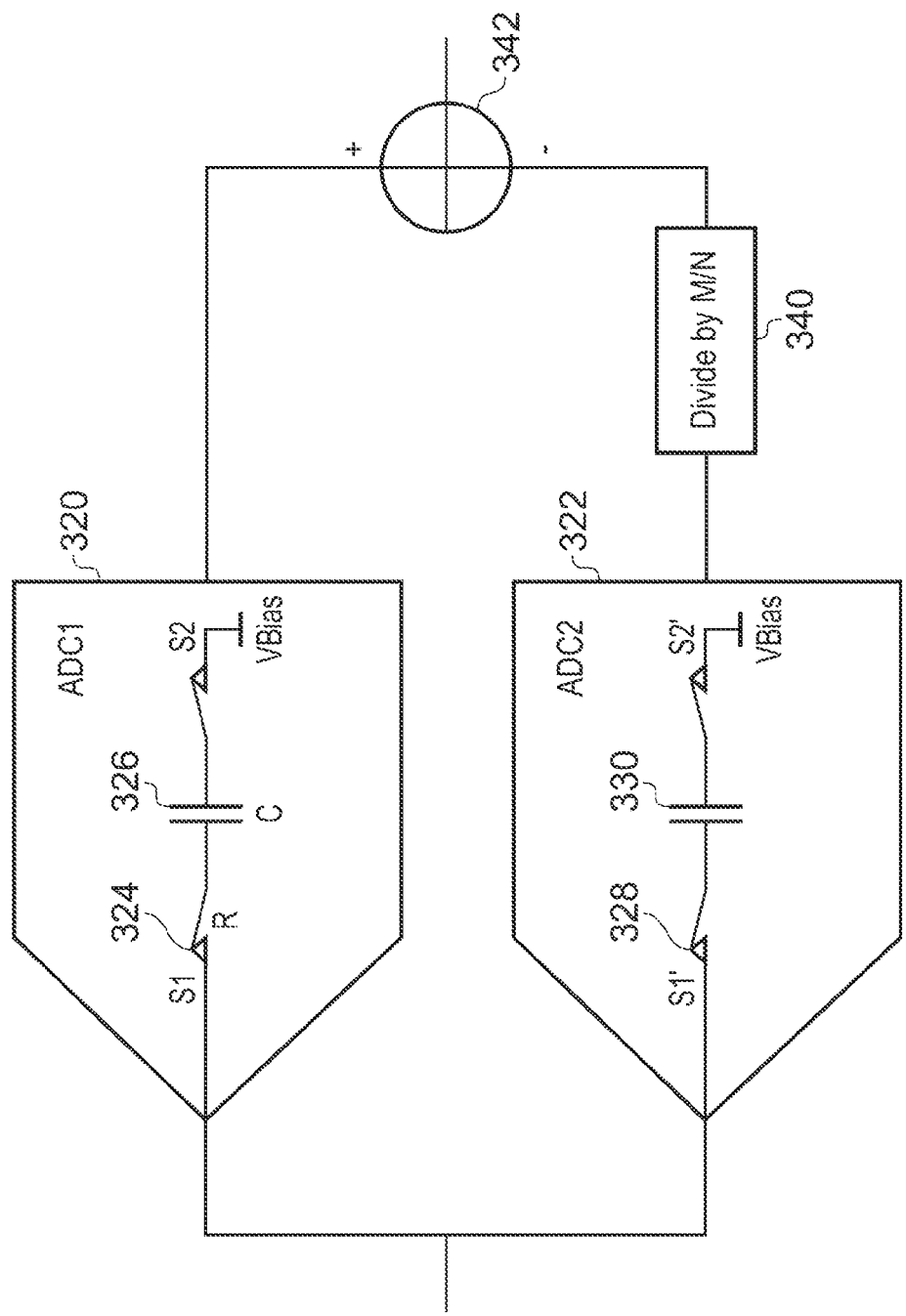
FIG. 23 is a circuit diagram of a digital embodiment of the present invention.

In the embodiments discussed so far, the subtraction of the signal in the compensation channel from the signal in the main channel has been done by an analog subtractor based around an operational amplifier or a comparator. However the invention can also be implemented in the digital domain. In the example shown in FIG. 23, two ADCs, 320 and 322 are formed. The ADC 320 is represented by a sampling switch 324 having a resistance R ohms and a capacitor 326. The second ADC 322 acts as the compensation channel, as is represented by a sampling switch 328 and a sampling capacitor 330.

The resistor 328 and capacitor 330 are scaled by M and N as per the teachings herein. Once the ADC's 320 and 322 have completed their respective conversions, the result of the ADC 322 in the compensation channel is divided by M/N and subtracted from the output of the ADC 320 of the primary channel. This calculation may be performed by a processor which may have been provided to perform other calculations, or it may be performed by dedicated hardware, such as divider 340 and subtractor 342 of FIG. 23.

In alternative embodiments the capacitor values in each ADC may be equal, but the resistances may be varied by fabricating dissimilar sampling switches, scaled by M. Under such circumstances, and with some assumptions about the nature of the input signal, the capacitor may be used in time multiplexed manner with the switches to provide the first and second signal paths.

It is thus possible to reduce distortion within a sampling circuit and within an ADC.

The claims presented here are written in single dependency format suitable for filing at the USPTO. However, in general, it is to be understood that each claim may depend on any preceding claim of the same type, except where that is clearly technically infeasible.

The invention claimed is:

1. A sampling circuit comprising:
   an input node having a single voltage signal;
   a first signal path comprising a first sampling capacitor and a first signal path switch in a signal path between the input node and a first plate of the first sampling capacitor;
   a second signal path comprising a second sampling capacitor and a second signal path switch in a signal path between the input node and a first plate of the second sampling capacitor, and
   a signal processing circuit for forming a difference between a signal sampled onto the first sampling capacitor from the single voltage signal and a signal sampled onto the second sampling capacitor from the single voltage signal.

2. A sampling circuit as claimed in claim 1, in which the capacitance of the first sampling capacitor is different from the capacitance of the second sampling capacitor.

3. A sampling circuit as claimed in claim 1, in which the capacitance of the first sampling capacitor is N times the capacitance of the second sampling capacitor, the impedance of the second switch is M times the impedance of the first switch, and in which M is substantially equal to $N^2$.

4. A sampling circuit as claimed in claim 3, in which the first and second switches are formed of transistors, and when comparing aspect ratios of width divided by length of the transistors of the first and second switches, the or each transistor in the first switch has an aspect ratio which is M times larger than the or each transistor in the second switch.

5. A sampling circuit as claimed in claim 1, in which the first and second switches are transmission gate switches.

6. A sampling circuit as claimed 1, where the first signal path further includes a second switch for selectively connecting the first plate of the first sampling capacitor to ground or to a bias voltage or to a reference voltage, a third switch for connecting a second plate of the first sampling capacitor to ground or to a bias voltage, and a fourth switch for connecting the second plate of the first sampling capacitor to an adding input of the signal processing circuit.

7. A sampling circuit as claimed in claim 6, in which the second signal path further includes a second switch for selectively connecting the first plate of the second sampling capacitor to ground or to a bias voltage or to a reference voltage, a third switch for connecting a second plate of the second sampling capacitor to ground or to a bias voltage, and a fourth switch for connecting the second plate of the second sampling capacitor to a subtracting input of the signal processing circuit.

8. A sampling circuit as claimed in claim 6, where the second switch is operable to connect the first plate of the first sampling capacitor to reference voltages used as part of an analog to digital conversion, or wherein at least one additional switch is provided to connect the first plate of the first sampling capacitor to the reference voltage or to a further reference voltage used as part of an analog to digital conversion.

9. A sampling circuit as claimed in claim 1, in which the processing circuit is an operational amplifier or a comparator.

10. A sampling circuit as claimed in claim 1, in which the capacitance of the first sampling capacitor is equal to the capacitance of the second sampling capacitor, and the signal processing circuit outputs an estimate of the error voltage.

11. A sampling circuit as claimed in claim 1, in which the first switch comprises at least two NMOS transistors connected in parallel and sharing a drain or source region.

12. A sampling circuit as claimed in claim 1, in which the first switch comprises at least two PMOS transistors connected in parallel and sharing a drain or source region.

13. A sampling circuit as claimed in claim 1, in which the second switch comprises at least two field effect transistors connected in series and sharing a doped region which acts as a drain for one of the series connected transistors and a source for a second of the series connected transistors.

14. A sampling circuit as claimed in claim 1, which the second switch comprises two or more banks of series connected transistors, with one transistor of the first bank of transistors and one transistor of the second bank of transistors sharing a drain or source region.

15. A sampling circuit as claimed in claim 1, further comprising an additional capacitive load connected between a ground, bias, or supply voltage and the first plate of the second sampling capacitor so as to increase the current flowing through the second signal path switch.

16. A sampling circuit as claimed in claim 1, in which the first sampling capacitor is one of a plurality of sampling capacitors in a first array of capacitors, and the first signal path switch is one of a plurality of switches associated with respective ones of the capacitors.

17. A sampling circuit as claimed in claim 16, in which the second sampling capacitor is one of a plurality of capacitors within a second array of capacitors, and the second signal path switch is one of the plurality of switches associated with respective ones of the capacitors in the second array.

18. A sampling circuit as claimed in claim 17, in which the plurality of capacitors in the first and second arrays are sized with respect to one another such that an additional capacitance is added to capacitors of the first array to compensate for the capacitance of the second array such that a predetermined sequence of bit trial values is obtained when the first and second arrays are used within an analog to digital converter.

19. A sampling circuit as claimed in claim 3, in which the signals sampled onto the first and second sampling capacitors are converted to first and second digital values, and the second digital value is scaled and subtracted from the first digital value.

20. An analog to digital converter including at least one sampling circuit as claimed in claim 1.

21. An analog to digital converter as claimed in claim 20, in which the analog to digital converter is a SAR converter, a pipelined converter, a delta sigma converter or a combination thereof.

22. A method of correcting for voltage errors in a sampling network, comprising forming two sampling networks where at least one of capacitances and switch resistances vary between one network and the other such that dissimilar sampling errors occur from sampling a single voltage signal, and processing the dissimilar errors so as to estimate or to remove the sampling error from a sample result.

23. A method as claimed in claim 22, wherein the first network has a first sampling capacitor having a capacitance of C, the second network has a second sampling capacitor having a capacitance of $$\frac{C}{N},$$

a switch resistance in the series with the capacitance of the first network is R, the switch resistance of a switch in series with the capacitance of the second network is substantially MR, and M is substantially equal to $N^2$.

24. A method as claimed in claim 22, in which the processing comprises subtracting the output from the second sampling network from the output of the first sampling network.

25. A method as claimed in claim 22, in which the signals sampled onto the first and second sampling capacitors are converted to first and second digital values, and the second digital value is scaled and subtracted from the first digital value.

* * * * *

UNITED STATES PATENT AND TRADEMARK OFFICE
CERTIFICATE OF CORRECTION

| | | |
|---|---|---|
| PATENT NO. | : 8,816,887 B2 | Page 1 of 1 |
| APPLICATION NO. | : 13/624334 | |
| DATED | : August 26, 2014 | |
| INVENTOR(S) | : Hurrell et al. | |

It is certified that error appears in the above-identified patent and that said Letters Patent is hereby corrected as shown below:

Claims

In column 16, line 1, change "as claimed 1" to --as claimed in claim 1--

Signed and Sealed this
Twenty-ninth Day of September, 2015

Michelle K. Lee
*Director of the United States Patent and Trademark Office*